United States Patent
Kawae et al.

(10) Patent No.: US 9,000,441 B2
(45) Date of Patent: Apr. 7, 2015

(54) SEMICONDUCTOR DEVICE AND DISPLAY DEVICE

(75) Inventors: Daisuke Kawae, Kanagawa (JP);
Yoshiyuki Kurokawa, Kanagawa (JP);
Hidekazu Miyairi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 1106 days.

(21) Appl. No.: 12/504,897

(22) Filed: Jul. 17, 2009

(65) Prior Publication Data

US 2010/0032679 A1 Feb. 11, 2010

(30) Foreign Application Priority Data

Aug. 5, 2008 (JP) ................................ 2008-202387
Aug. 5, 2008 (JP) ................................ 2008-202439

(51) Int. Cl.

| | |
|---|---|
| *H01L 27/14* | (2006.01) |
| *H01L 29/786* | (2006.01) |
| *H01L 27/12* | (2006.01) |
| *H01L 29/04* | (2006.01) |
| *H01L 29/66* | (2006.01) |

(52) U.S. Cl.
CPC ...... *H01L 29/78696* (2013.01); *H01L 27/1214* (2013.01); *H01L 29/04* (2013.01); *H01L 29/66765* (2013.01); *H01L 29/78645* (2013.01)

(58) Field of Classification Search
USPC .............. 257/E29.117, 151, 202, 59, 72, 347; 349/42, 43
See application file for complete search history.

(56) References Cited

U.S. PATENT DOCUMENTS

| | | |
|---|---|---|
| 4,409,134 A | 10/1983 | Yamazaki |
| 5,101,242 A | 3/1992 | Ikeda et al. |
| 5,221,631 A | 6/1993 | Ikeda et al. |
| 5,644,147 A | 7/1997 | Yamazaki et al. |
| 5,818,070 A | 10/1998 | Yamazaki et al. |
| 6,639,246 B2 | 10/2003 | Honda |
| 6,730,970 B1 | 5/2004 | Katoh et al. |

(Continued)

FOREIGN PATENT DOCUMENTS

| | | |
|---|---|---|
| EP | 0 383 743 A2 | 8/1990 |
| JP | 57-099732 A | 6/1982 |

(Continued)

OTHER PUBLICATIONS

Cho, et al., "Characteristics of a-Si:H Dual-Gate TFT's Using ITO Electrode for LCD Driver", AM-FPD '08: Digest of Technical Papers, pp. 229-232.

*Primary Examiner* — Yu-Hsi D Sun
(74) *Attorney, Agent, or Firm* — Nixon Peabody LLP; Jeffrey L. Costellia

(57) ABSTRACT

A thin film transistor whose threshold voltage can be controlled and which has a favorable switching characteristic is provided. The thin film transistor includes a first gate electrode layer; a semiconductor layer; a first gate insulating layer provided between the first gate electrode layer and the semiconductor layer; source electrode and drain electrode layers which are provided over the semiconductor layer; a conductive layer covered by the first gate insulating layer and the semiconductor layer and provided so as to overlap with part of the first gate electrode layer; a second gate insulating layer provided so as to cover at least a back channel portion of the semiconductor layer; and a second gate electrode layer provided over the second gate insulating layer so as to overlap with the back channel portion of the semiconductor layer.

9 Claims, 33 Drawing Sheets

(56) References Cited

U.S. PATENT DOCUMENTS

| | | |
|---|---|---|
| 6,740,938 B2 | 5/2004 | Tsunoda et al. |
| 6,803,296 B2 * | 10/2004 | Miyairi .................. 438/486 |
| 6,927,456 B2 | 8/2005 | Honda |
| 6,982,194 B2 | 1/2006 | Tsunoda et al. |
| 7,189,997 B2 | 3/2007 | Tsunoda et al. |
| 2006/0027804 A1 * | 2/2006 | Yamazaki et al. ............. 257/59 |
| 2007/0072439 A1 * | 3/2007 | Akimoto et al. ............. 438/795 |

FOREIGN PATENT DOCUMENTS

| | | |
|---|---|---|
| JP | 02-218166 A | 8/1990 |
| JP | 05-190857 A | 7/1993 |
| JP | 06-202156 A | 7/1994 |
| JP | 07-047876 | 11/1995 |
| JP | 2839529 | 12/1998 |
| JP | 2001-144298 A | 5/2001 |
| JP | 2002-182245 A | 6/2002 |

* cited by examiner

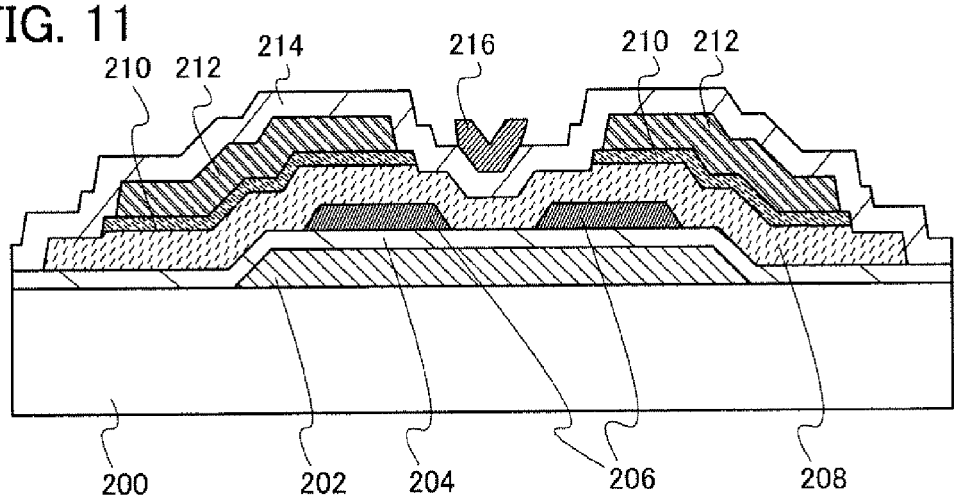

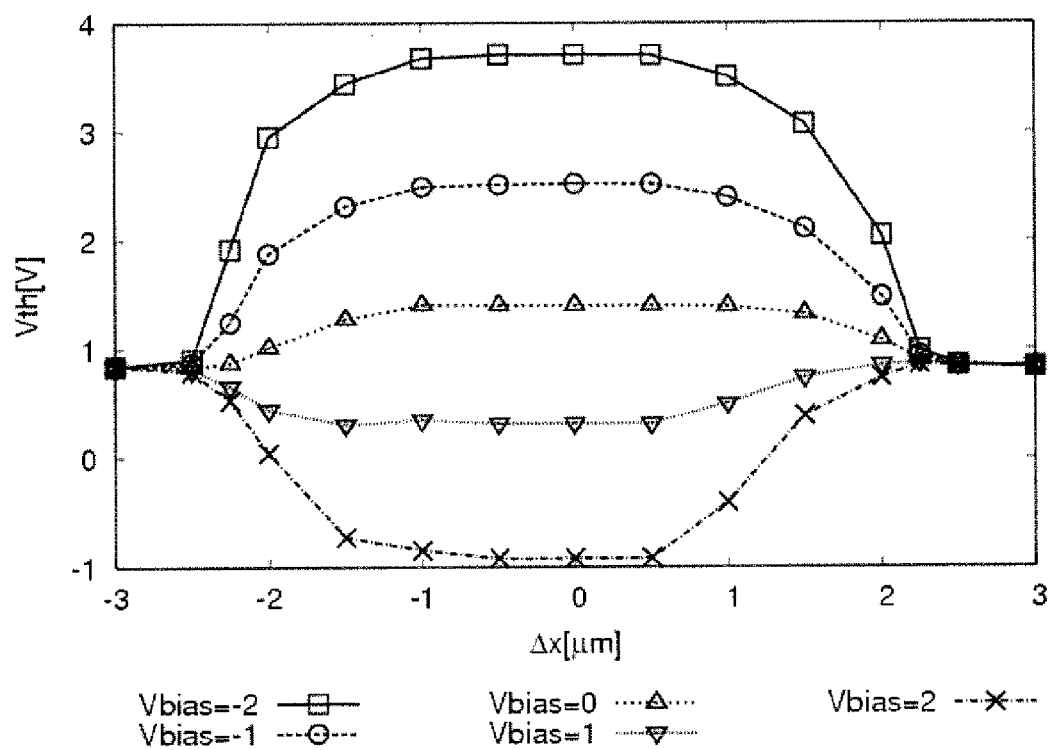

214

215

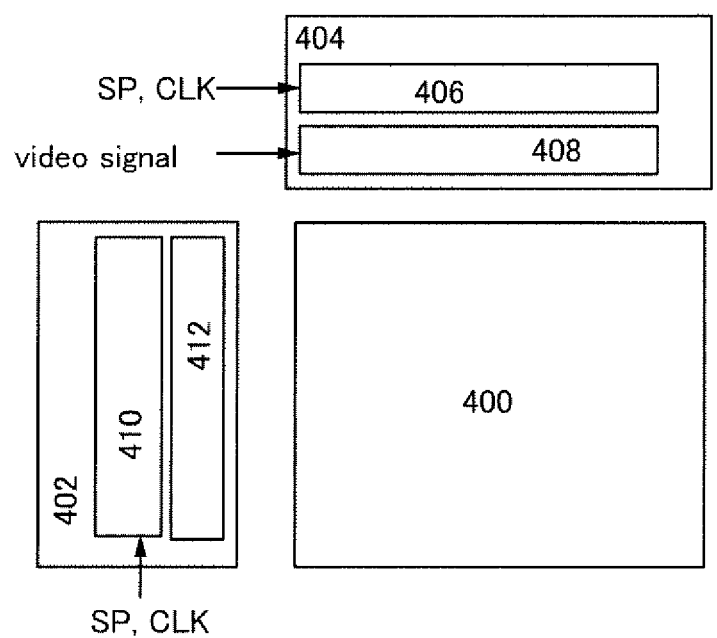

SEMICONDUCTOR DEVICE AND DISPLAY DEVICE

BACKGROUND OF THE INVENTION

1. Field of the Invention

The present invention relates to a thin film transistor, a display device, and a method for driving the display device.

2. Description of the Related Art

As one type of field effect transistor, a thin film transistor is known in which a semiconductor layer which is provided over a substrate having an insulating surface is used for a channel formation region. Techniques are widely known in which amorphous silicon, microcrystalline silicon, and polycrystalline silicon are used for semiconductor layers used in thin film transistors. Thin film transistors have been used, for example, for liquid crystal television devices and put into practical use as switching transistors for pixels of display screens thereof.

A thin film transistor in which an amorphous silicon layer is used for a channel formation region has low electric field effect mobility (approximately 0.4 cm$^2$/V·sec to 0.8 cm$^2$/V·sec) and low on current. On the other hand, a thin film transistor in which a microcrystalline silicon layer is used for a channel formation region has high electric field effect mobility as compared with a thin film transistor in which an amorphous silicon layer is used for a channel formation region. However, the thin film transistor including a microcrystalline silicon layer has high off current as well as high on current and therefore cannot have a sufficient switching characteristic.

A thin film transistor in which a polycrystalline silicon layer is used for a channel formation region has characteristics in that the electric field effect mobility is far higher than those of the above-described two kinds of thin film transistors and the on current is high. Therefore, the thin film transistor including a polycrystalline silicon layer can be used as not only a switching transistor provided in a pixel but also a transistor for a driver circuit which needs to operate at high speed. However, a step of crystallizing a semiconductor layer is needed in a manufacturing process of the thin film transistor in which a polycrystalline silicon layer is used for a channel formation region; thus, there is a problem of high manufacturing cost as compared to manufacturing processes of the above-described thin film transistor including an amorphous silicon layer and thin film transistor including a microcrystalline silicon layer. Further, when laser annealing is employed for crystallizing the semiconductor layer, an area irradiated with a laser beam is small, and thus a liquid crystal panel having a large screen cannot be efficiently produced.

Glass substrates used for manufacturing display panels have been increased in size every year, started from the first generation (e.g., 320 mm×400 mm) to the eighth generation (e.g., 2200 mm×2400 mm) today. It is predicted that glass substrates will be further increased in size from now on, such as the ninth generation (e.g., 2400 mm×2800 mm) and the tenth generation (e.g., 2950 mm×3400 mm). However, no technique has been established yet which is capable of manufacturing a thin film transistor capable of high-speed operation (e.g., the above-described thin film transistor including a polycrystalline silicon layer) over such a large-size glass substrate with high productivity. As the technique by which a thin film transistor capable of high-speed operation is manufactured over a large-size substrate, a technique of manufacturing a thin film transistor in which a microcrystalline silicon layer is used for a channel formation region has been advanced; however, sufficient characteristics of the thin film transistor have not been obtained yet.

A thin film transistor is turned on when a gate voltage (a difference in potential between a source and a gate when the potential of the source is a reference potential) reaches or exceeds a threshold voltage. The threshold voltage is determined depending on the structure of the thin film transistor, the deposition condition of each layer of the thin film transistor, or the like. A technique is known by which, at a position opposite to a gate electrode, a gate electrode (called a back gate electrode) is further provided in order to control the threshold voltage of a thin film transistor (for example, see Non-Patent Document 1). According to Non-Patent Document 1, an insulating film is provided so as to cover a thin film transistor and a back gate electrode is formed using the same layer as a pixel electrode in a region that overlaps with a back channel over the insulating film. The pixel electrode is formed from ITO (indium tin oxide); therefore, the back gate electrode is also formed from ITO. The amount of a drain current (a current flowing between a source and a drain) increases by use of the back gate electrode and accordingly, the amount of on current increases.

On the other hand, a technique for increasing the amount of on current by providing a buffer layer between a gate insulating layer and a semiconductor layer has been disclosed (see Patent Document 1). According to Patent Document 1, the buffer layer suppresses the change in amount of effective charge induced on a semiconductor surface; for example, the buffer layer is formed from a material with a larger band gap width than the semiconductor layer or with higher carrier density than the semiconductor layer. The provision of the buffer layer can also suppress the change in threshold voltage over time and suppress the variation in threshold voltage.

In addition, thin film transistors are required to be capable of high-speed operation. As one way for operating thin film transistors at high speed, a technique by which the minimum channel length is shortened has been disclosed (for example, see Patent Document 2).

REFERENCES

[Patent Document 1] Japanese Patent No. 2839529
[Patent Document 2] Examined Utility Model Application Publication No. H7-047876
[Non-Patent Document 1] Yong-Soo Cho et al., "Characteristics of a-Si:H Dual-Gate TFTs Using ITO Electrode for LCD Driver", AM-FPD'08 DIGEST OF TECHNICAL PAPERS, pp. 229-232

SUMMARY OF THE INVENTION

It is an object of an embodiment of the present invention to provide a thin film transistor in which the amount of on current is large and the amount of off current is small, which can be formed using a large-sized substrate, and which can be used for a display device. It is another object of an embodiment of the present invention to provide a thin film transistor whose threshold voltage can be controlled, which can be used for a display device, and which can operate at high speed.

It is still another object of an embodiment of the present invention to manufacture a thin film transistor, which can be used for a display device, and which has the above-mentioned characteristics, through a simple process.

An embodiment of the present invention is a thin film transistor including a first gate electrode layer, a first semiconductor layer, a second semiconductor layer, a first gate insulating layer provided between the first gate electrode layer and the first semiconductor layer, source electrode and drain electrode layers which are provided over the second semiconductor layer with layers having ohmic contact with the second semiconductor layer interposed between the source electrode and drain electrode layers and the second semiconductor layer, a second gate insulating layer provided so as to cover at least a back channel portion of the second semiconductor layer, and a second gate electrode layer provided over the second gate insulating layer so as to overlap with the back channel portion of the second semiconductor layer, wherein the first semiconductor layer is provided below and in contact with the second semiconductor layer, and wherein the first semiconductor layer has higher conductivity than the second semiconductor layer.

Another embodiment of the present invention is a thin film transistor including a first gate electrode layer, a semiconductor layer, a first gate insulating layer provided between the first gate electrode layer and the semiconductor layer, source electrode and drain electrode layers which are provided over the semiconductor layer with layers having ohmic contact with the semiconductor layer interposed between the source electrode and drain electrode layers and the semiconductor layer, a conductive layer covered by the first gate insulating layer and the semiconductor layer and provided so as to overlap with part of the first gate electrode layer, a second gate insulating layer provided so as to cover at least a back channel portion of the semiconductor layer, and a second gate electrode layer provided over the second gate insulating layer so as to overlap with the back channel portion of the semiconductor layer.

Another embodiment of the present invention is a thin film transistor including a first gate electrode layer, a semiconductor layer, a first gate insulating layer provided between the first gate electrode layer and the semiconductor layer, source electrode and drain electrode layers which are provided over the semiconductor layer with layers having ohmic contact with the semiconductor layer interposed between the source electrode and drain electrode layers and the semiconductor layer, a conductive layer covered by the first gate insulating layer and the semiconductor layer and provided so as to overlap with part of the first gate electrode layer, a second gate insulating layer provided so as to cover at least a back channel portion of the semiconductor layer, and a second gate electrode layer provided over the second gate insulating layer so as to overlap with the back channel portion of the semiconductor layer, wherein the conductive layer is separated into two regions in a region that does not overlap with the source electrode and drain electrode layers, one of the two regions overlaps with one of the source electrode and drain electrode layers, and the other of the two regions overlaps with the other of the source electrode and drain electrode layers.

Another embodiment of the present invention is a thin film transistor including a first gate electrode layer, a semiconductor layer, a first gate insulating layer provided between the first gate electrode layer and the semiconductor layer, source electrode and drain electrode layers which are provided over the semiconductor layer with layers having ohmic contact with the semiconductor layer interposed between the source electrode and drain electrode layers and the semiconductor layer, a conductive layer covered by the first gate insulating layer and the semiconductor layer and provided so as to overlap with part of the first gate electrode layer, a second gate insulating layer provided so as to cover at least a back channel portion of the semiconductor layer, and a second gate electrode layer provided over the second gate insulating layer so as to overlap with the back channel portion of the semiconductor layer, wherein the conductive layer overlaps with one of the source electrode and drain electrode layers and does not overlap with the other of the source electrode and drain electrode layers.

In the aforementioned thin film transistor, the amount of on current is large when the thin film transistor includes the conductive layer and the amount of off current is small when the thin film transistor includes the semiconductor layer serving as a buffer layer; moreover, it is possible to further increase the amount of on current and decrease the amount of off current when the thin film transistor includes the second gate electrode.

Moreover, the thin film transistor having the above structure can be used for a display device. A display device according to an embodiment of the present invention includes the thin film transistor having the above structure, wherein the second gate electrode layer is preferably formed using the same layer as a pixel electrode layer. This is because the second gate electrode layer can be formed through the same steps as the pixel electrode layer when the second gate electrode layer is formed using the pixel electrode layer.

In the display device having the above structure, the pixel electrode layer is preferably formed from a material having a light-transmitting property. When the pixel electrode layer is formed from a material having a light-transmitting property, a transmissive liquid crystal display device can be fabricated.

In the display device having the above structure, the potential of the second gate electrode when the thin film transistor is on is preferably equal to the potential of the first gate electrode and the potential of the second gate electrode when the thin film transistor is off is preferably kept constant. By the driving performed in this manner, a thin film transistor in which the amount of on current is increased and the amount of off current is decreased and which has a high switching characteristic can be provided.

In the thin film transistor having the conductive layer with the above structure, carriers flowing between a source region and a drain region go through the conductive layer at least part of which is provided to overlap with the gate electrode layer and go through an amorphous semiconductor layer provided on and in contact with the conductive layer.

In the thin film transistor having the conductive layer with the above structure, the conductive layer is provided not over the entire region in the channel length direction of the thin film transistor but partly in the channel length direction, and an amorphous semiconductor layer is provided between an impurity semiconductor layer and the conductive layer and between a pair of conductive layers. That is to say, carriers flowing in a channel go through the amorphous semiconductor layer at a certain distance in the channel length direction between the source region and the drain region. The conductive layer can be formed from, for example, a microcrystalline semiconductor. When the conductive layer is formed from a microcrystalline semiconductor, ohmic contact with an amorphous semiconductor is possible. That is to say, the amount of on current can be increased.

Note that in the thin film transistor having the conductive layer with the above structure, the electrical conductivity of the conductive layer is preferably greater than or equal to $1\times10^{-5}$ S·cm$^{-1}$ and less than or equal to $5\times10^{-2}$ S·cm$^{-1}$ and the electrical conductivity of the amorphous semiconductor layer is lower than that of the conductive layer.

Further, the position of the second gate electrode is important. The second gate electrode is provided in a region that overlaps with the back channel portion of the semiconductor layer with the second gate insulating layer interposed between the second gate electrode and the semiconductor layer and has a depressed portion at this position. Therefore, the alignment at the formation of the second gate electrode is not difficult and the second gate electrode is disposed in a suitable region in a self-aligning manner.

Then, the second gate electrode is preferably disposed so as not to overlap with the source electrode and the drain electrode. This is for the purpose of reducing the parasitic capacitance generated between the second gate electrode, and the source electrode and drain electrode layers.

Note that silicon oxynitride means silicon that includes more oxygen than nitrogen. In the case where measurements are performed using Rutherford backscattering spectrometry (RBS) and hydrogen forward scattering (HFS), silicon oxynitride includes oxygen, nitrogen, silicon, and hydrogen at concentrations ranging from 50 at. % to 70 at. %, 0.5 at. % to 15 at. %, 25 at. % to 35 at. %, and 0.1 at. % to 10 at. %, respectively. Further, silicon nitride oxide means silicon that includes more nitrogen than oxygen. In the case where measurements are performed using RBS and HFS, silicon nitride oxide includes oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively. Note that percentages of nitrogen, oxygen, silicon, and hydrogen fall within the ranges given above, where the total number of atoms contained in the silicon oxynitride or the silicon nitride oxide is defined as 100 at. %.

The impurity semiconductor refers to a semiconductor to which an impurity element having one conductivity type is added, in which the majority of carriers contributing to the electrical conduction are supplied from this impurity element having one conductivity type. The impurity element having one conductivity type is an element that can serve as a donor for supplying electrons as carriers or serve as an acceptor for supplying holes as carriers. As the donor, Group 15 elements in the periodic table are typically given. As the acceptor, Group 13 elements in the periodic table are typically given.

A microcrystalline semiconductor refers to a crystalline semiconductor which has a grain size greater than or equal to 2 nm and less than or equal to 200 nm, preferably greater than or equal to 10 nm and less than or equal to 80 nm, more preferably greater than or equal to 20 nm and less than or equal to 50 nm, and which has an electrical conductivity of approximately $10^{-7}$ S·cm$^{-1}$ to $10^{-4}$ S·cm$^{-1}$ which can be increased up to approximately $10^{-1}$ S·cm$^{-1}$ by valence control. The concept of microcrystalline semiconductors is not necessarily defined by the above-described grain diameter, electrical conductivity, or the like as long as the physical property values are similar.

Note that the amorphous semiconductor refers to a semiconductor without a crystalline structure (without long-range order in atomic arrangement). Amorphous silicon is typically used. Note that amorphous silicon may include hydrogen or the like.

The on current refers to current that flows between a source region and a drain region, that is, current that flows through a channel formation region when a thin film transistor is in an on state (that is, the state where an appropriate gate voltage is applied to a gate electrode so that current flows through the channel formation region). Here, the on state refers to a state where a gate voltage (a difference in potential between a gate electrode and a source region) exceeds the threshold voltage of the transistor.

The off current refers to current that flows between a source region and a drain region, that is, current that flows through a channel formation region when a thin film transistor is in an off state (that is, the state where the gate voltage of the thin film transistor is lower than the threshold voltage).

The thin film transistor whose threshold voltage can be controlled and parasitic capacitance is suppressed, in which the amount of on current is large and the amount of off current is small, and which can operate at high speed can be manufactured.

As described above, since the amount of on current is large and the amount of off current is small, the switching characteristic is improved. By the use of such a thin film transistor for a display device, the display device can have higher contrast ratio.

Even in the case where the thin film transistor with the above characteristics is used for a display device, the display device can be manufactured without increasing the number of steps.

BRIEF DESCRIPTION OF THE DRAWINGS

FIG. 11 illustrates an example of a thin film transistor.

FIG. 18 illustrates results of the calculation on the structures illustrated in FIGS. 12A to 12C.

FIG. 30 is a block diagram illustrating a structure of a display device.

DETAILED DESCRIPTION OF THE INVENTION

Figure 1:
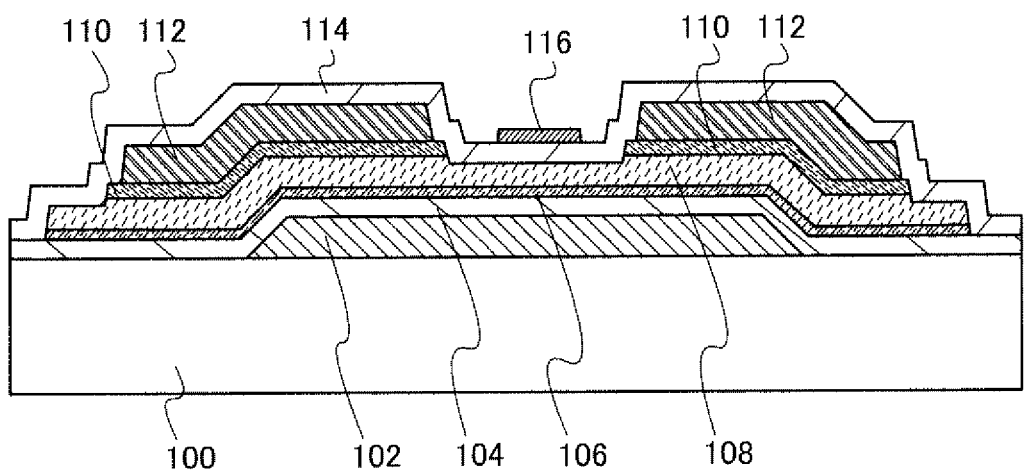
FIG. 1 illustrates an example of a thin film transistor.

Embodiments of the present invention are specifically described below with reference to drawings. The present invention can be carried out in many different modes without being limited to the description given below. It is easily understood by those skilled in the art that modes and details disclosed herein can be modified in various ways without departing from the spirit and scope of the present invention. Therefore, the present invention should not be construed as being limited to the description of the embodiments below. In the description of the present invention, which is made with reference to the drawings, the reference numeral denoting the same part is used in different drawings. The same hatch pattern is applied to similar parts, and the similar parts are not especially denoted by reference numerals in some cases. Moreover, an insulating layer is not drawn in a top view in some cases for convenience.

(Embodiment 1)

Embodiment 1 describes a thin film transistor according to an embodiment of the present invention and its manufacturing method.

FIG. 1 illustrates an example of a thin film transistor according to an embodiment of the present invention. The thin film transistor illustrated in FIG. 1 includes a first gate electrode layer 102 over a substrate 100, a semiconductor layer 106 over the first gate electrode layer 102, a semiconductor layer 108 over the semiconductor layer 106, a first gate insulating layer 104 between the first gate electrode layer 102 and the semiconductor layer 106, source electrode and drain electrode layers 112 provided over the semiconductor layer 108 with layers (impurity semiconductor layers 110) having ohmic contact with the semiconductor layer 108 interposed between the layers 112 and the semiconductor layer 108, a second gate insulating layer 114 provided so as to cover at least a back channel portion of the semiconductor layer 108, and a second gate electrode layer 116 provided over the second gate insulating layer 114 so as to overlap with the back channel portion of the semiconductor layer 108. The semiconductor layer 106 is formed from a semiconductor with higher conductivity than the semiconductor layer 108.

As the substrate 100, a glass substrate, a ceramic substrate, a plastic substrate with heat resistance that can withstand the process temperature in manufacturing steps, or the like can be used. In the case where a light-transmitting property is not necessary for the substrate, a metal substrate such as a stainless steel alloy substrate whose surface is covered by an insulating film may be used. As the glass substrate, for example, a substrate of alkali-free glass such as barium borosilicate glass, aluminoborosilicate glass, or aluminosilicate glass may be used.

The first gate electrode layer 102 is formed from a conductive material. The first gate electrode layer 102 can be formed from a conductive material, for example, a metal material such as titanium, molybdenum, chromium, tantalum, tungsten, aluminum, copper, neodymium, niobium, or scandium, or an alloy material including any of those as a main component. Note that the material of the first gate electrode layer 102 needs to have heat resistance that can withstand later steps (such as formation of the first gate insulating layer 104) and is not etched or eroded in later steps. The material of the first gate electrode layer 102 is not limited to a particular material as long as the above conditions are satisfied.

The first gate electrode layer 102 may be formed as a single layer or a stack of layers of the aforementioned metal materials or the like. In particular, in the case where the first gate electrode layer 102 is formed from aluminum, formation of a titanium layer, a molybdenum layer, or the like over the aluminum layer can prevent aluminum from entering the first gate insulating layer 104 or the like.

The first gate insulating layer 104 is formed using a single layer or a stack of layers of a silicon nitride layer, a silicon oxynitride layer, or a silicon nitride oxide layer. When the first gate insulating layer 104 is formed from silicon nitride, it is possible to prevent impurity elements such as sodium in the substrate 100 from entering the semiconductor layer serving as the channel formation region, and the like. Furthermore, the oxidation of the first gate electrode layer 102 can be prevented.

The first gate insulating layer 104 is formed to have preferably a thickness greater than or equal to 50 nm and less than or equal to 550 nm, more preferably a thickness greater than or equal to 50 nm and less than or equal to 300 nm. In particular, in the case where the first gate electrode layer 102 is formed by a sputtering method, the first gate electrode layer 102 often has an uneven surface; however, the aforementioned thickness can relieve the decrease in coverage due to the unevenness.

The semiconductor layer 106 is formed from a material with higher conductivity than the semiconductor layer 108. For example, when the semiconductor layer 108 is formed from an amorphous semiconductor, the semiconductor layer 106 can be formed from a microcrystalline semiconductor. In the case where the semiconductor layer 106 is formed from a microcrystalline semiconductor, the conductivity can be further improved by the addition of an impurity element having one conductivity type (such as phosphorus).

The semiconductor layer 108 is provided as a buffer layer and may be formed from an amorphous semiconductor. To this amorphous semiconductor, hydrogen, nitrogen, or halogen such as fluorine or chlorine may be added. The semiconductor layer 108 may have a thickness greater than or equal to 30 nm and less than or equal to 200 nm, preferably greater than or equal to 50 nm and less than or equal to 150 nm. As the amorphous semiconductor, amorphous silicon is typically given. By the provision of the semiconductor layer 108, the amount of off current can be decreased.

When the semiconductor layer 108 is formed using an amorphous semiconductor layer (preferably including hydrogen, nitrogen, or halogen), native oxidation of a surface of a crystal grain of a microcrystalline semiconductor layer can be prevented. In particular, in a region where the amorphous semiconductor is in contact with a microcrystal grain in the microcrystalline semiconductor layer, stress concentrates so that a crack easily happens. If the crack is exposed to oxygen, the crystal grain is oxidized, so that a silicon oxide layer is formed. Therefore, the formation of the amorphous semiconductor layer on a surface of the microcrystalline semiconductor layer can prevent the oxidation of the crystal grains. Accordingly, defects which trap carriers can be decreased and a region where carrier movement is interrupted can be made small. As a result, high-speed operation of the thin film transistor becomes possible and the amount of on current can be increased.

As the semiconductor layer 106, a semiconductor layer including nitrogen or an NH group and having a crystalline region in an amorphous structure may be provided instead of the microcrystalline semiconductor layer. The crystalline region of such a semiconductor layer may include a crystal grain with an inverted pyramidal or conic shape or a microcrystal grain with a diameter greater than or equal to 1 nm and less than or equal to 10 nm (preferably greater than or equal to 1 nm and less than or equal to 5 nm) or may include both of the above crystal grains. These crystal grains are provided in a dispersed manner. The "inverted conical or inverted pyramidal shape" is constructed by (i) a base which is constructed by a plurality of planes and (ii) lines linking the periphery of the base and a vertex which is located outside the base, wherein the vertex exists on a substrate side. The crystal grain includes a single crystal or twin crystals. Here, preferably, the crystal plane orientation of a side surface of the inverted pyramidal or inverted conical shape is aligned and the side surface thereof is straight. Therefore, in this case, it can be considered that the crystal grain is more like a single crystal or a form including twin crystals than a form including a plurality of crystals. In the case of the form including twin crystals, as compared to the case of the form including a plurality of crystals, the number of dangling bonds is small; therefore, the number of defects and the amount of off current are small. Further, the number of grain boundaries is small and the amount of on current is large in the case of the form including twin crystals as compared to the case of the form including a plurality of crystals. Note that the crystal grain may include a plurality of crystals. Note that the term "twin crystals" means that two different crystal grains are bonded to each other with significantly high consistency at a crystal boundary. In other words, the "twin crystals" have a structure in which a trap level due to crystal defects or the like is hardly formed because crystal lattices are continuously arranged at a crystal boundary. Thus, it can be considered that substantially a crystal boundary does not exist in a region having such a crystal structure.

The semiconductor layer including nitrogen or an NH group and having a crystal region in an amorphous structure has lower oxygen concentration than nitrogen concentration and includes few defects. When a nitrogen atom of the NH group cross-links the dangling bonds of silicon atoms at the boundary of the adjacent crystal regions (that is, grain boundary) or at the boundary between the crystalline region and the amorphous structure, the defect level is decreased, so that the amount of leakage current can be suppressed. Further, the crystal regions are provided in a dispersed manner in the amorphous structure and the number of crystal grain boundaries is few; therefore, the amount of on current can be increased.

Such a semiconductor layer may be formed in such a manner that a large amount of nitrogen or ammonia is provided on a surface of the gate insulating layer, on which the semiconductor layer is to be formed. As an example, after the formation of the gate insulating layer, the surface of the gate insulating layer is sprayed with gas including nitrogen so that nitrogen is adsorbed on a surface of the first gate insulating layer 104. Alternatively, the gate insulating layer may be exposed to plasma generated by gas including nitrogen. As the gas including nitrogen, a mixed gas of nitrogen and hydrogen, or ammonia can be given, for example.

Alternatively, the inner wall of a process chamber where the semiconductor layer is formed may be covered by a film including nitrogen at high concentration. As a material including nitrogen at high concentration, silicon nitride can be given, for example. A gas including an NH bond (typically ammonia) may be used as a material of silicon nitride and this gas may be adsorbed in a reaction chamber. Note that the film including nitrogen at high concentration which covers the inner wall of the process chamber is preferably formed at the same time as the formation of the gate insulating layer because the process can be simplified.

Alternatively, the concentration of oxygen in the gas used for forming the semiconductor layer may be suppressed and the concentration of nitrogen may be increased. Further, a gas including an NH bond (typically ammonia) is preferably included in the gas used for forming the semiconductor layer.

Further, the semiconductor layer 108 may be formed using the semiconductor layer including nitrogen or an NH group and having a crystalline region in an amorphous structure.

The impurity semiconductor layers 110 are provided between the semiconductor layer 108 and the source electrode and drain electrode layers 112. In the case where the semiconductor layer 108 is formed from an amorphous semiconductor and the source electrode and drain electrode layers 112 are formed from metal, the impurity semiconductor layers 110 are provided so that those layers 108 and 112 have ohmic contact with each other and the impurity semiconductor layers 110 serve as a source region and a drain region. Therefore, the impurity semiconductor layers 110 are not particularly necessary in the case where the semiconductor layer 108 and the source electrode and drain electrode layers 112 have ohmic contact with each other without the provision of the impurity semiconductor layers 110.

Here, when the thin film transistor to be formed is an n-channel thin film transistor, for example, phosphorus may be added to the impurity semiconductor layers 110 as the impurity element. In order to add phosphorus, a gas including an impurity element imparting one conductivity type, such as $PH_3$, may be added to silicon hydride which is used for the formation of the impurity semiconductor layers 110. When the thin film transistor to be formed is a p-channel thin film transistor, on the other hand, boron may be added as the impurity element, for example. In order to add boron, an impurity gas such as $B_2H_6$ may be added to silicon hydride which is used for the formation of the impurity semiconductor layers 110. The concentration of phosphorus or boron in the impurity semiconductor layer 110 is preferably in the range of $1\times10^{19}$ cm$^{-3}$ to $1\times10^{21}$ cm$^{-3}$. The impurity semiconductor layers 110 may be formed from an amorphous semiconductor or a microcrystalline semiconductor. The impurity semiconductor layers 110 may be formed to a thickness greater than or equal to 10 nm and less than or equal to 100 nm, preferably greater than or equal to 30 nm and less than or equal to 50 nm. When the thickness of each impurity semiconductor layer 110 is decreased, the throughput of the formation is improved.

The source electrode and drain electrode layers 112 may be formed from a conductive material, for example, a metal material. For example, a single layer or a stack of layers of aluminum, aluminum including an element which improves heat resistance, or aluminum including an element which prevents hillock (hereinafter the latter two aluminum is called aluminum alloy) is preferably used. Here, as examples of the element which improves heat resistance or the element which prevents hillock, there are copper, silicon, titanium, neodymium, scandium, molybdenum, and the like. Alternatively, a stacked structure may be employed in which a layer including titanium, tantalum, molybdenum, tungsten, or a nitride of any of these is formed in contact with the impurity semiconductor layers 110 and a layer including aluminum or aluminum alloy is formed thereover. In such a structure, it is possible to prevent aluminum from entering the semiconductor layer 108. Further, a stacked structure may be employed in which a top surface and a bottom surface of a layer including aluminum or aluminum alloy is sandwiched between layers including titanium, tantalum, molybdenum, tungsten, or a nitride of any of these. For example, a stack of conductive layers in which an aluminum layer is provided over a titanium layer and another titanium layer is provided over the aluminum layer can be used.

Note that the materials mentioned as being usable for the first gate electrode layer 102 can be used for the source electrode and drain electrode layers 112, and the materials mentioned as being usable for the source electrode and drain electrode layers 112 can be used for the first gate electrode layer 102.

The second gate insulating layer 114 is formed using a silicon nitride layer, a silicon oxynitride layer, or a silicon nitride oxide layer as a single layer or a stack of layers, in a manner similar to the first gate insulating layer 104. The second gate insulating layer 114 is formed to a thickness greater than or equal to 50 nm and less than or equal to 550 nm, preferably greater than or equal to 50 nm and less than or equal to 300 nm, in a manner similar to the first gate insulating layer 104.

The second gate electrode layer 116 can be formed from a material that is similar to the materials of the first gate electrode layer 102 and the source electrode and drain electrode layers 112. By the provision of the second gate electrode layer 116, the threshold voltage of the thin film transistor can be controlled.

Next, an example of a method for manufacturing the thin film transistor illustrated in FIG. 1 is described with reference to FIGS. 2A to 2C, FIGS. 3A to 3C, FIGS. 4A to 4C, FIGS. 5A to 5C, and FIGS. 6A and 6B. In this example, the semiconductor layer 108 is formed from an amorphous semiconductor.

First, a conductive layer used for the first gate electrode layer 102 is formed over the substrate 100 by a sputtering method, a CVD method, or the like and the conductive layer is patterned by a photolithography process or the like. After that, a resist mask is removed.

Figure 2A:
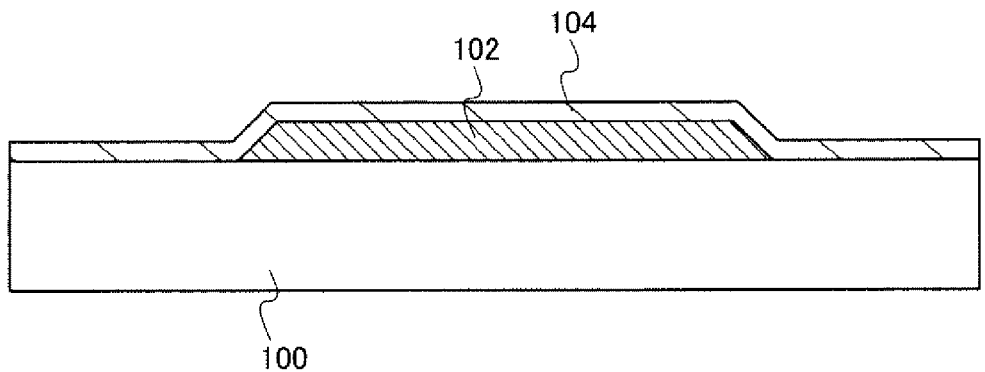
FIGS. 2A to 2C illustrate an example of a process for manufacturing a thin film transistor.

Next, the first gate insulating layer 104 is formed so as to cover the first gate electrode layer 102 (see FIG. 2A).

Figure 2B:
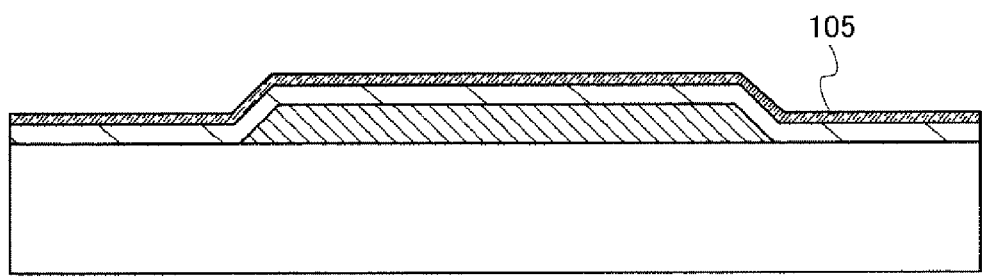
Figure 2C:
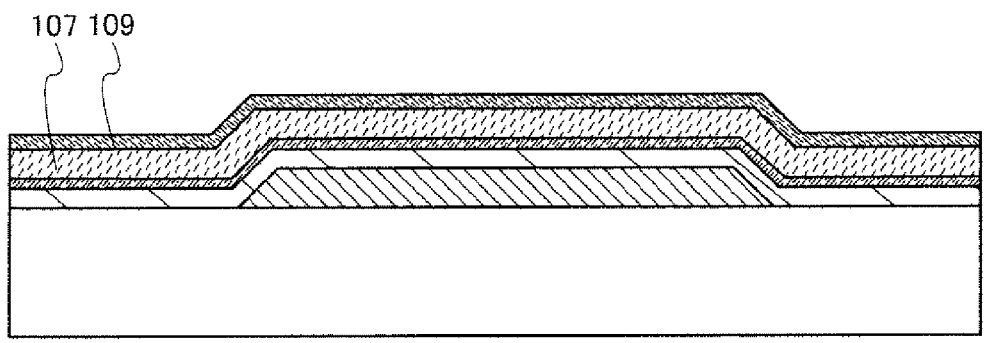
Figure 3A:
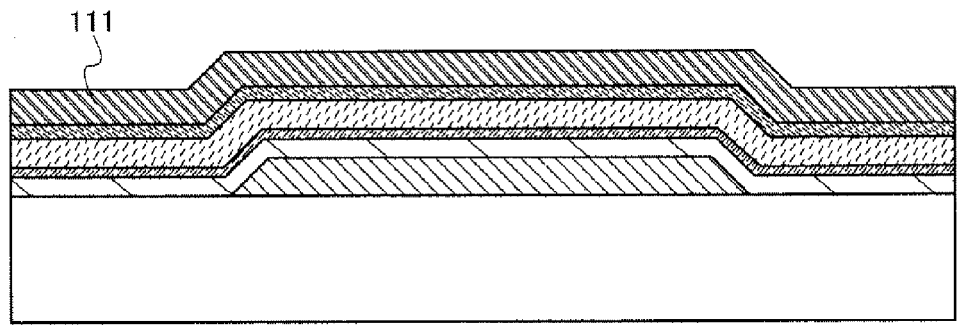
FIGS. 3A to 3C illustrate an example of a process for manufacturing a thin film transistor.

Next, a semiconductor layer 105 used for the semiconductor layer 106, a semiconductor layer 107 used for the semiconductor layer 108, an impurity semiconductor layer 109 used for the impurity semiconductor layers 110, and a conductive layer 111 used for the source electrode and drain electrode layers 112 are formed in that order over the first gate insulating layer 104 (see FIGS. 2B and 2C and FIG. 3A).

Figure 3B:
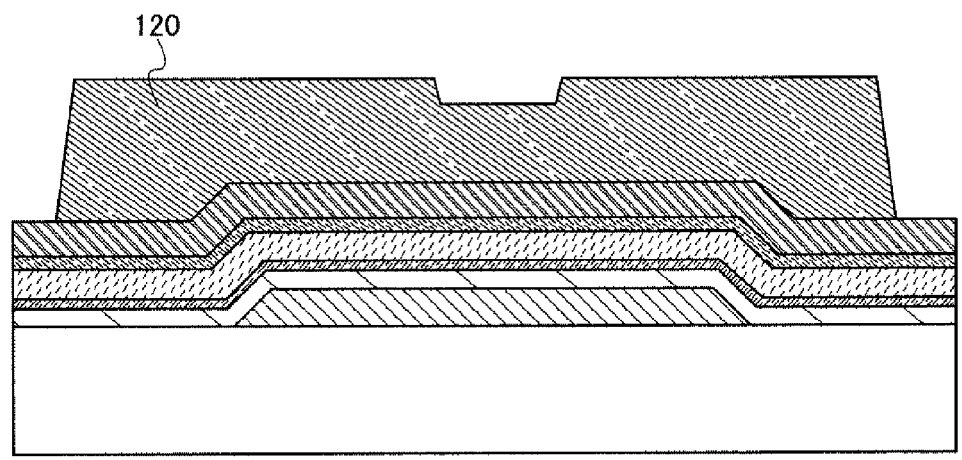

After that, a first resist mask 120 is formed over those layers (see FIG. 3B).

The first resist mask 120 is a resist mask having a depressed portion or a projecting portion. In other words, the first resist mask 120 can also be referred to as a resist mask including a plurality of regions (here, two regions) having different thicknesses. A region of the first resist mask 120, which has large thickness, is referred to as a projecting portion of the first resist mask 120. A region of the first resist mask 120, which has small thickness, is referred to as a depressed portion of the first resist mask 120.

In the first resist mask 120, the projecting portion is formed in a region where the source and drain electrode layers 112 are to be formed and the depressed portion is formed in a region where the semiconductor layer is exposed without existence of the source and drain electrode layers 112.

The first resist mask 120 can be formed using a common multi-tone mask. Here, multi-tone masks are described with reference to FIGS. 7A to 7D.

A multi-tone mask is a mask capable of light exposure with multi-level light intensity, and typically, light exposure is performed with three levels of light intensity to provide an exposed region, a semi-exposed region, and an unexposed region. When the multi-tone mask is used, one-time light exposure and development process allows a resist mask to be formed with plural thicknesses (typically, two levels of thicknesses). Therefore, by the use of the multi-tone mask, the number of photomasks can be reduced.

Figure 7A:
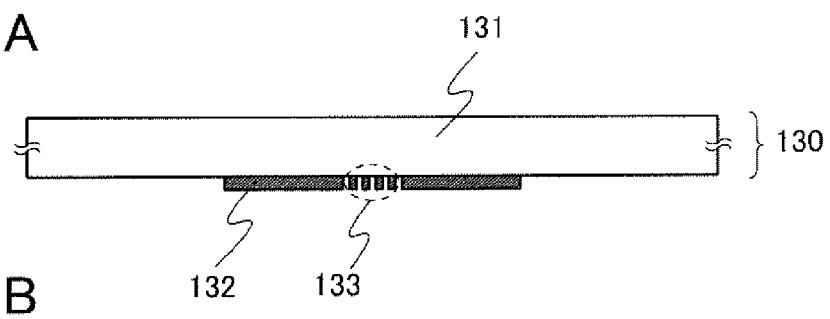
FIGS. 7A to 7D illustrate multi-tone masks.
Figure 7B:
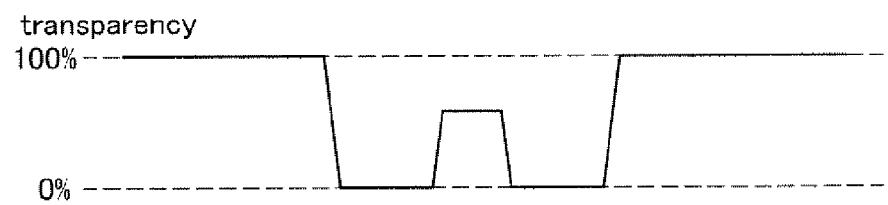
Figure 7C:
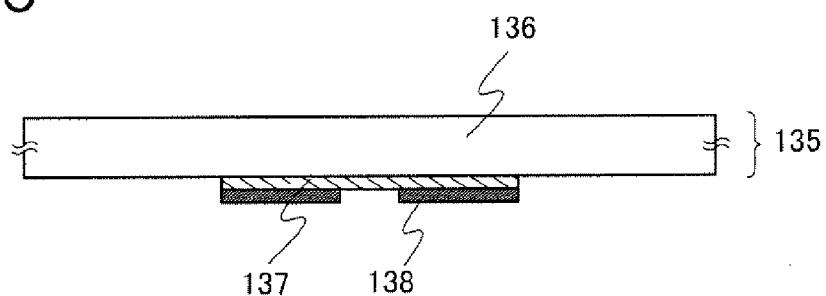
Figure 7D:
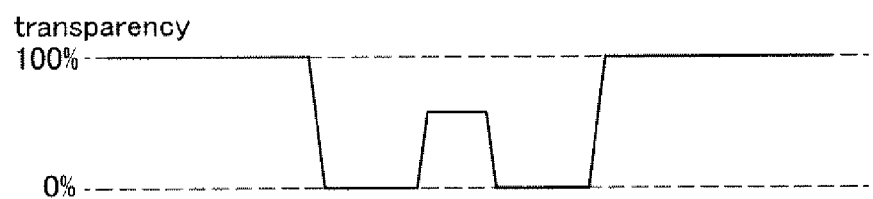

FIGS. 7A to 7D illustrate cross sections of typical multi-tone masks and their light transmittance. FIGS. 7A and 7B illustrate a gray tone mask 130 and its light transmittance and FIGS. 7C and 7D illustrate a halftone mask 135 and its light transmittance.

The gray tone mask 130 illustrated in FIG. 7A includes a light-blocking portion 132 formed using a light-blocking film and a diffraction grating portion 133 formed by a pattern of the light-blocking film, which are provided on a substrate 131 having a light-transmitting property.

The light transmittance is controlled at the diffraction grating portion 133 in such a manner that slits, dots, mesh, or the like are provided at an interval less than or equal to the resolution limit of light used for light exposure. Note that the slits, dots, or meshes may be provided in the diffraction grating portion 133 in periodic intervals or non-periodic intervals.

For the substrate 131 having a light-transmitting property, a quartz substrate or the like can be used. The light-blocking film used for the light-blocking portion 132 and the diffraction grating portion 133 is formed using a metal film, preferably a film of chromium, chromium oxide, or the like.

In the case where the gray tone mask 130 is irradiated with light for light exposure, as illustrated in FIG. 7B, the light transmittance of the region overlapping with the light-blocking portion 132 is 0%, and the light transmittance of the region where neither the light-blocking portion 132 nor the diffraction grating portion 133 is provided is 100%. Further, the light transmittance of the diffraction grating portion 133 is approximately in the range of 10% to 70%, which can be adjusted by the interval of slits, dots, or mesh of the diffraction grating, or the like.

The halftone mask 135 illustrated in FIG. 7C includes a semi-light-transmitting portion 137 formed using a semi-light-transmitting film and a light-blocking portion 138 formed using a light-blocking film, which are provided on a substrate 136 having a light-transmitting property.

The semi-light-transmitting portion 137 can be formed using a film of MoSiN, MoSi, MoSiO, MoSiON, CrSi, or the like. The light-blocking portion 138 is formed using a metal film which is similar to the light-blocking film of the gray tone mask and is preferably provided using chromium, chromium oxide, or the like.

In the case where the halftone mask 135 is irradiated with light for light exposure, as illustrated in FIG. 7D, the light transmittance of the region overlapping with the light-blocking portion 138 is 0%, and the transmittance of the region where neither the light-blocking portion 138 nor the semi-light-transmitting portion 137 is provided is 100%. Further, the light transmittance of the semi-light-transmitting portion 137 is approximately in the range of 10% to 70%, which can be adjusted by the interval of slits, dots, or mesh of the diffraction grating, or the like.

By light exposure using the multi-tone mask and development, the first resist mask 120 which includes regions having different thicknesses can be formed.

Figure 3C:
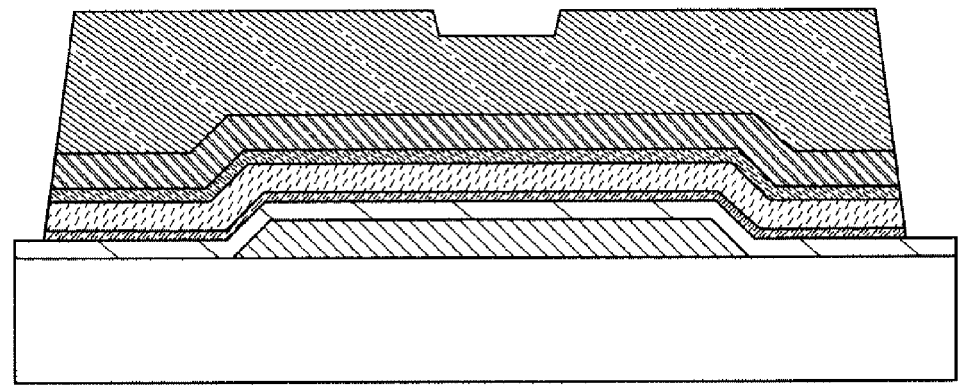

Next, the semiconductor layer, the impurity semiconductor layer, and the conductive layer are etched with the use of the first resist mask 120 (see FIG. 3C).

Figure 4A:
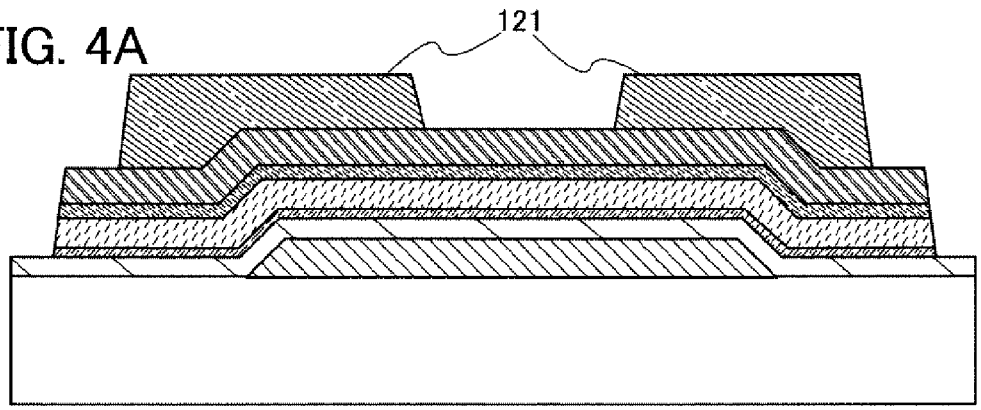
FIGS. 4A to 4C illustrate an example of a process for manufacturing a thin film transistor.

Next, the first resist mask 120 is decreased in size so that the conductive layer in a region overlapping with the depressed portion of the first resist mask 120 is exposed, whereby a second resist mask 121 is formed (see FIG. 4A). As a way for forming the second resist mask 121 by decreasing the first resist mask 120 in size, for example, ashing using oxygen plasma can be given. However, the way for forming the second resist mask 121 by decreasing the first resist mask 120 in size is not limited to the above ashing.

Figure 4B:
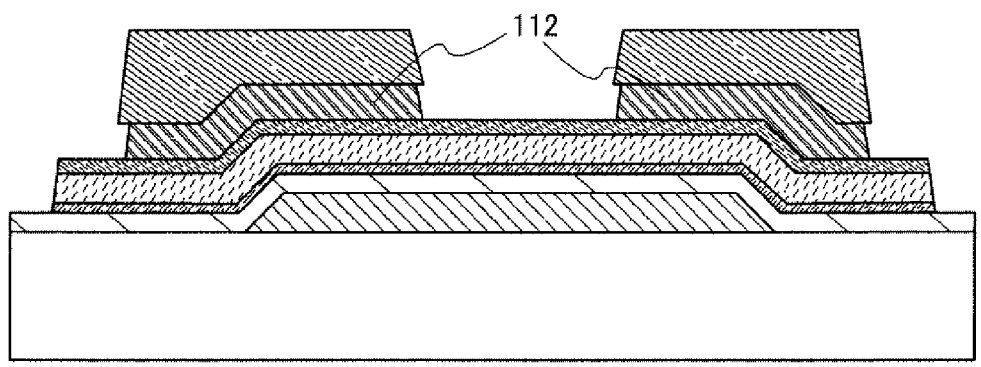

Next, the conductive layer is etched using the second resist mask 121, whereby the source electrode and drain electrode layers 112 are formed (see FIG. 4B). Here, the etching can be performed by dry etching or wet etching; wet etching is preferable. This is because the distance between the source electrode and the drain electrode can be increased by the wet etching.

Figure 4C:
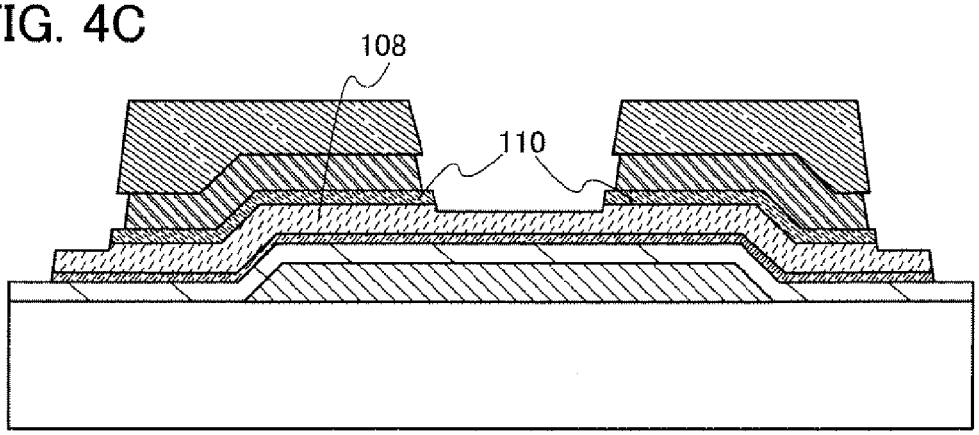

Next, an upper part of the semiconductor layer and the impurity semiconductor layer are etched using the second resist mask 121 (see FIG. 4C). Here, the etching can be performed by dry etching or wet etching; dry etching is preferable. This is because the dry etching makes possible the processing at high accuracy. Here, by etching the upper part of the semiconductor layer, a back channel portion is formed. After that, the second resist mask 121 is removed (see FIG. 5A).

Note that it is preferable to perform etching for the purpose of removing a residue and the like in the back channel portion after removal of the second resist mask 121. This etching step is performed while the semiconductor layer 108 and the like are exposed; therefore, the etching is performed preferably under the condition where the etching rate of the exposed semiconductor layer 108 is low and the surface to be etched is not easily damaged. Therefore, the etching is performed preferably by an inductively coupled plasma method. In the case where the etching is performed by an inductively coupled plasma method, the following process is particularly preferable: plasma is generated by applying RF power not to a substrate side (that is, non-biased state) but to a coiled electrode. Further, the etching is performed preferably by not continuous discharge but noncontinuous discharge (pulse discharge). By the noncontinuous discharge, the damage due to charge-up in the back channel portion, which is the surface to be etched, can be prevented.

Furthermore, after the etching performed for the purpose of removing the residue and the like in the back channel portion, plasma process is preferably performed while the back channel portion is exposed.

For example, in the case where $H_2O$ plasma is used in the plasma process performed while the back channel portion is exposed, this plasma process may be performed before the removal of the second resist mask 121. In this case, the second resist mask 121 can be removed by the plasma process.

Figure 5A:
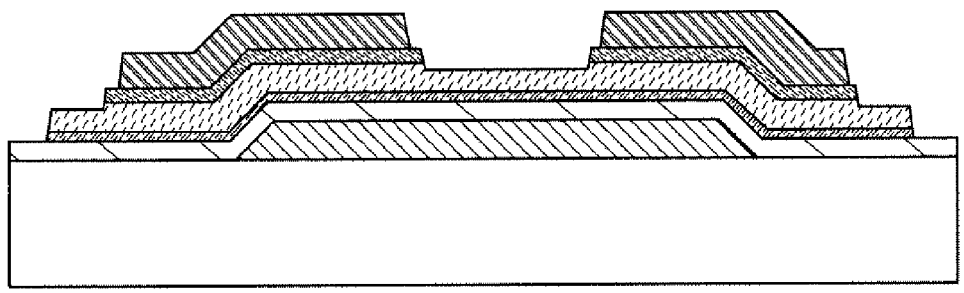
FIGS. 5A to 5C illustrate an example of a process for manufacturing a thin film transistor.
Figure 5B:
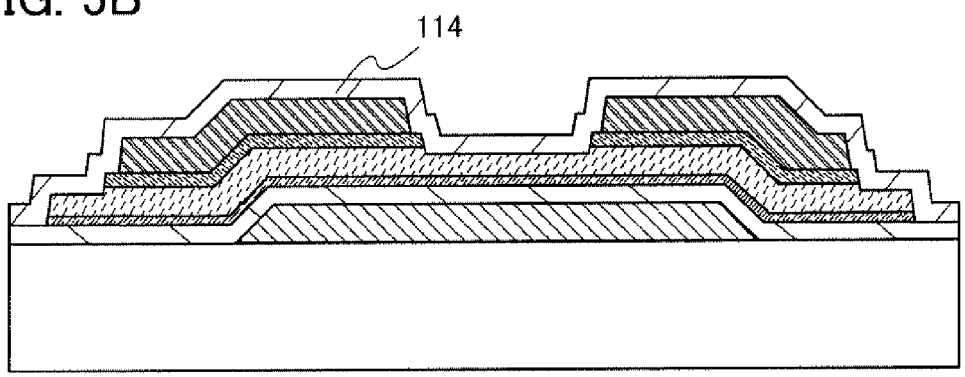

Next, the second gate insulating layer 114 is formed so as to cover at least the semiconductor layer 108, the impurity semiconductor layers 110, and the source electrode and drain electrode layers 112 (see FIG. 5B).

Figure 5C:
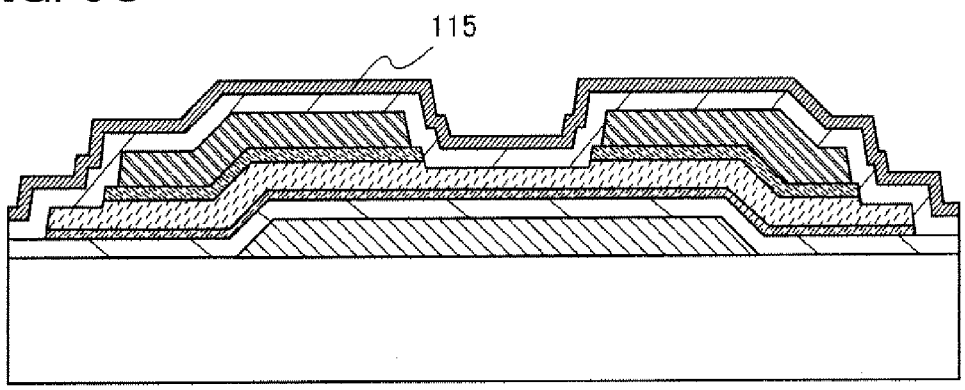
Figure 6A:
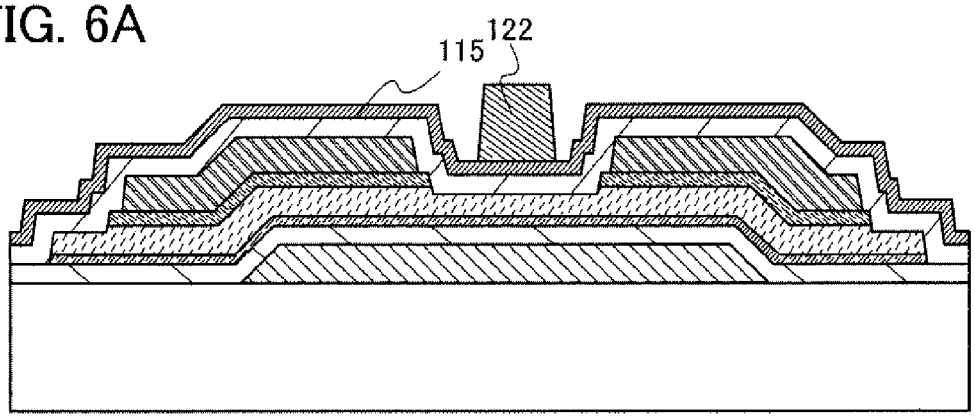
FIGS. 6A and 6B illustrate an example of a process for manufacturing a thin film transistor.
Figure 6B:
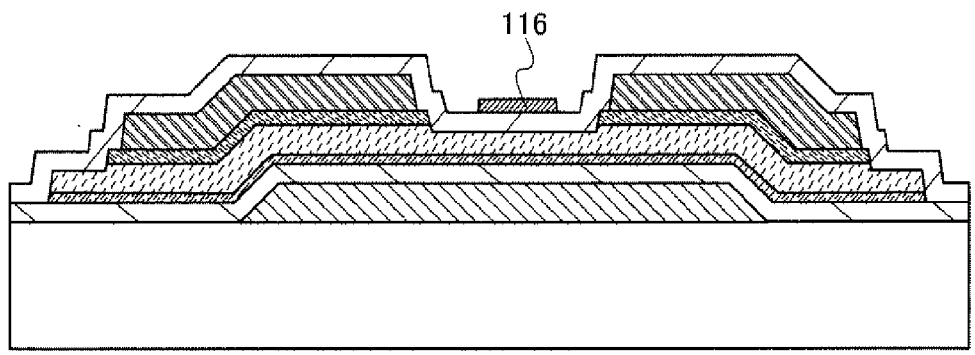

Next, a conductive layer 115 used for the second gate electrode layer 116 is formed over the second gate insulating layer 114 (see FIG. 5C). Then, a third resist mask 122 is formed over the conductive layer 115 (see FIG. 6A). After that, etching is performed using the third resist mask 122, whereby the second gate electrode layer 116 is formed; then, the third resist mask 122 is removed (see FIG, 6B).

The thin film transistor illustrated in FIG. 1 can be manufactured in the aforementioned manner.

(Embodiment 2)

The thin film transistor illustrated in Embodiment 1 can be used for a display device. In the case of using the thin film transistor for a display device, the second gate electrode is preferably formed at the same time as a pixel electrode layer. This is because when the second gate electrode is formed using the pixel electrode layer, the second gate electrode can be provided without increasing the number of steps. In Embodiment 2, a method for manufacturing a display device according to an embodiment of the present invention is described.

Figure 8A:
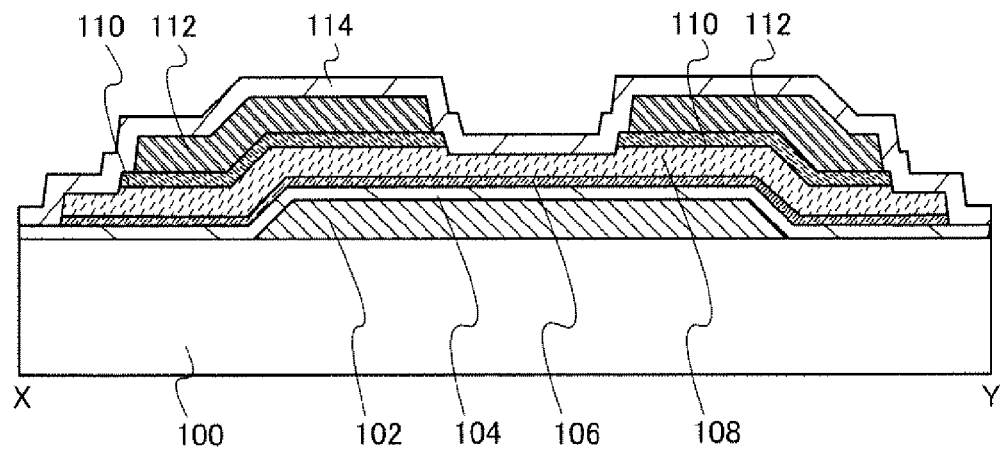
FIGS. 8A to 8C illustrate an example of a process for manufacturing a display device.

First, the steps up to the formation of the second gate insulating layer 114 are performed in a manner similar to Embodiment 1 (see FIG. 8A).

Figure 8B:
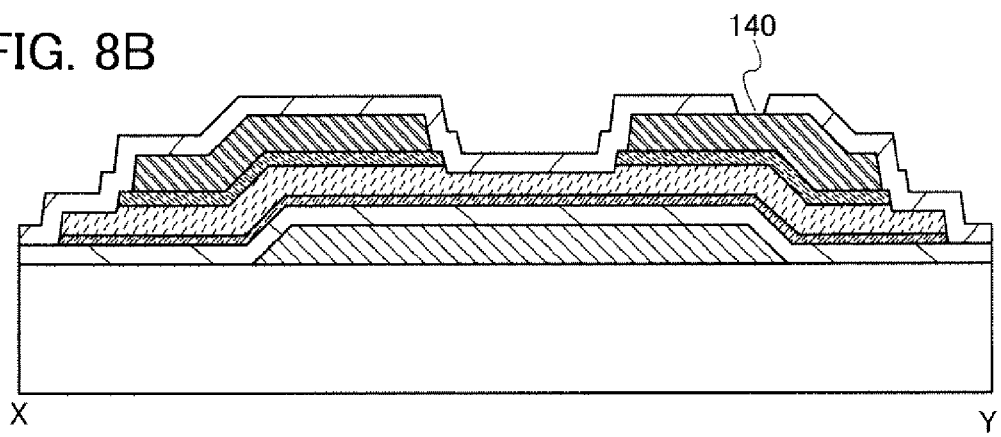

Next, the second gate insulating layer 114 is provided with an opening 140 (see FIG. 8B). The opening 140 is provided so that a drain electrode and a pixel electrode are connected to each other therein. The opening 140 can be formed by a photolithography process.

Figure 8C:
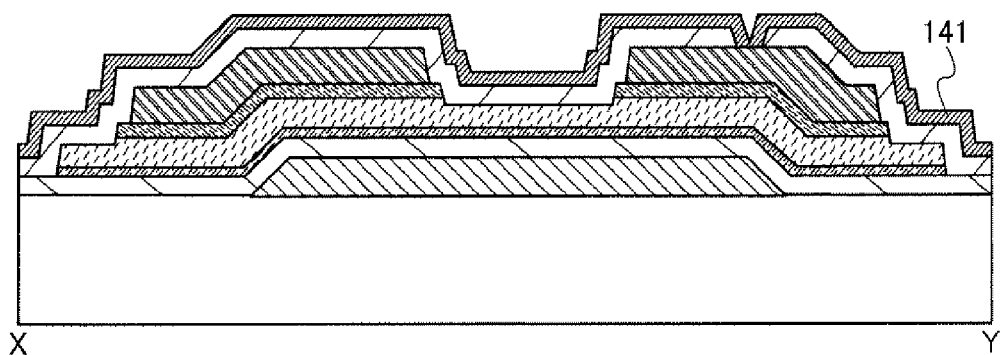

Next, a conductive layer 141 used for the pixel electrode is formed over the second gate insulating layer 114 (see FIG. 8C). Next, resist masks 142 are formed over the conductive layer 141 (see FIG. 9A). The resist masks 142 are provided so as to overlap with the position of the second gate electrode and the position of the pixel electrode.

Note that the conductive layer 141 is formed from a conductive material having a light-transmitting property, in the case of a transmissive liquid crystal display device or a top-emission light-emitting device. For example, the conductive layer 141 can be formed from indium oxide including tungsten oxide, indium zinc oxide including tungsten oxide, indium oxide including titanium oxide, indium tin oxide including titanium oxide, indium tin oxide (hereinafter called ITO), indium zinc oxide, indium tin oxide to which silicon oxide is added, or the like. Alternatively, a conductive composition including a conductive high molecule (also referred to as a conductive polymer) having a light-transmitting property can be used. Here, the conductive layer used for the pixel electrode is preferably has a sheet resistance of less than or equal to 10000 ohm/square and a light transmittance greater than or equal to 70% at a wavelength of 550 nm. Further, the resistivity of the conductive high molecule included in the conductive composition is preferably less than or equal to 0.1 $\Omega \cdot cm$. As the conductive high molecule, a so-called $\pi$ electron conjugated high molecule can be used. For example, polyaniline or a derivative thereof, polypyrrole or a derivative thereof, polythiophene or a derivative thereof, or a copolymer of two or more kinds of those materials can be given.

Next, the conductive layer 141 is etched using the resist masks 142, whereby a second gate electrode 143 and a pixel electrode 144 are formed. After that, the resist masks 142 are removed (see FIG. 9B).

The thin film transistor on which the steps up to the formation of the pixel electrode layer are completed in this manner can be used for a liquid crystal display device.

Note that when the second gate electrode is formed using the pixel electrode layer, sufficiently low resistivity cannot be obtained, so that wiring delay occurs in some cases. Therefore, even in the case where the thin film transistor is used for a display device, when the second gate electrode needs to have sufficiently low resistivity, a layer used for the second gate electrode is preferably formed separately. Here, the case where the second gate electrode needs to have sufficiently low resistivity refers to, for example, the case where the potential of a second gate electrode and the potential of a first gate electrode need to be different from each other.

In the case where the second gate electrode is formed separately, for example, a three-layer structure in which an aluminum layer is sandwiched between barrier layers is preferable. Here, as the barrier layer, for example, a molybdenum layer or a titanium layer is used. A manufacturing process in the case where a titanium layer is used is briefly described below. Note that the pixel electrode layer is formed from ITO.

First, a titanium layer, an aluminum layer, and a titanium layer are stacked in that order over the second gate insulating layer. Next, a resist mask is formed over the stack of these metal layers and the metal layers are etched using the resist mask, whereby a pattern of the second gate electrode is formed. Here, it is preferable to use an etchant by which the etching rate of aluminum is higher than that of titanium in the etching so that the aluminum layer sufficiently recedes inward. This is for the purpose of preventing oxidation of aluminum because when aluminum and ITO are in contact with each other, aluminum is oxidized. Therefore, the etching is preferably wet etching; for example, the wet etching employs an etchant including nitric acid, acetic acid, and phosphoric acid which are composed so as to make the etching rate of aluminum higher than that of titanium. After the etching, the resist mask is removed. FIG. 10C illustrates the thin film transistor formed in this manner.

Next, an ITO layer is formed over the second gate insulating layer and the second gate electrode which has been patterned, and a resist mask is formed over the ITO layer. Then, etching is performed on the ITO layer, so that a pattern of the pixel electrode is formed using ITO. After that, the resist mask is removed.

As described thus, the second gate electrode can be formed from a material different from the material of the pixel electrode layer.

Figure 9A:
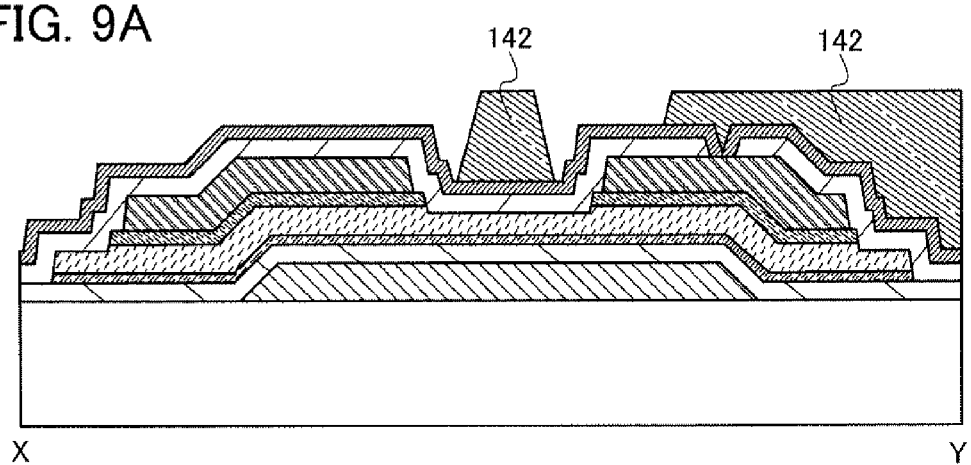
FIGS. 9A and 9B illustrate an example of a process for manufacturing a display device.
Figure 9B:
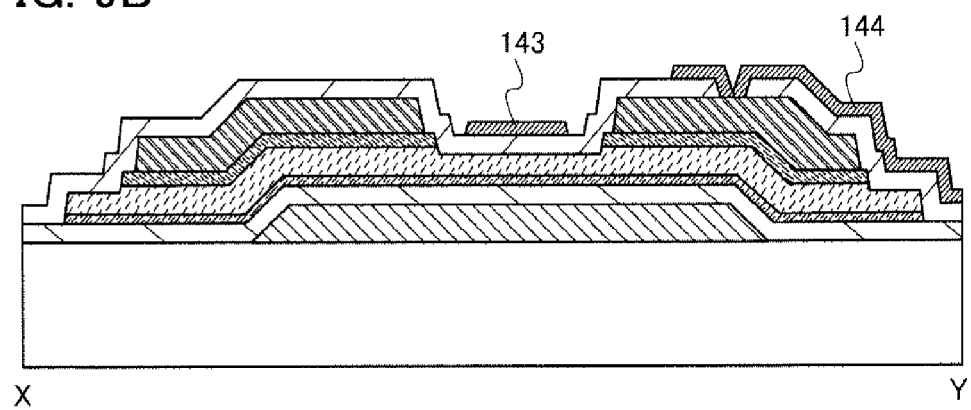
Figure 10A:
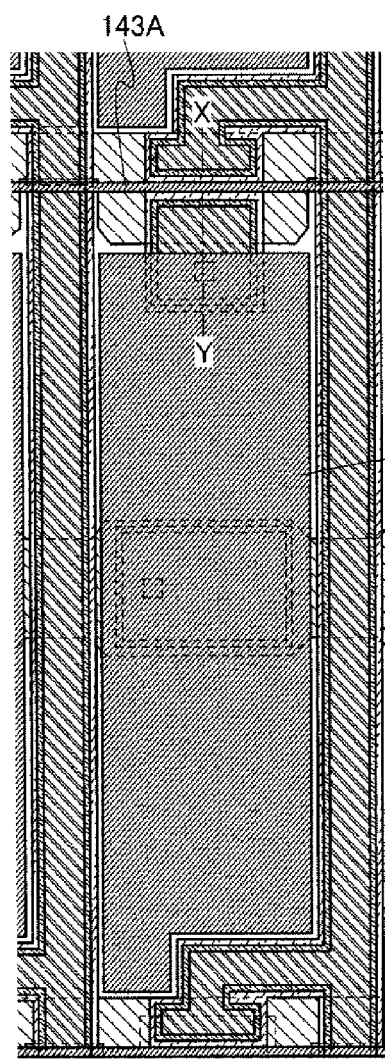
FIGS. 10A to 10C illustrate examples of a thin film transistor used for the display device.
Figure 10B:
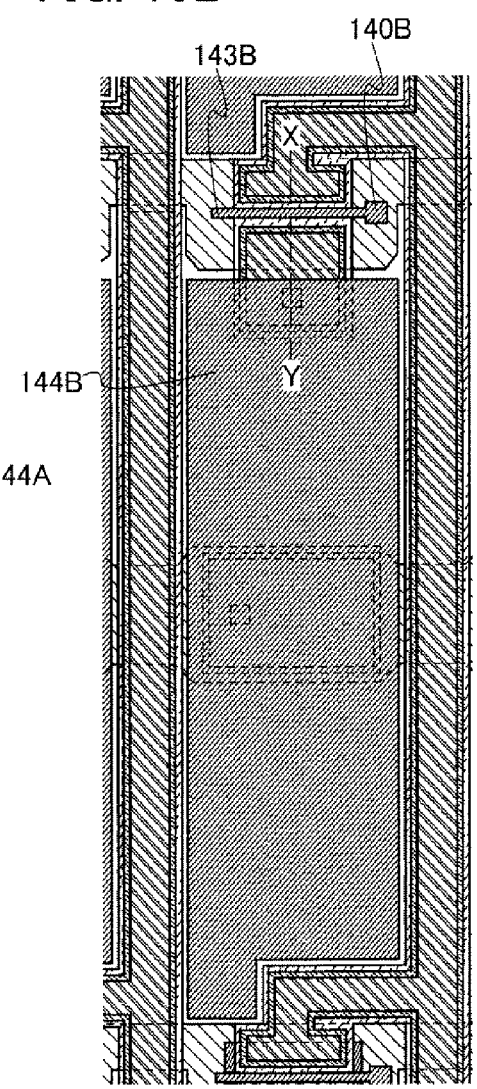
Figure 10C:
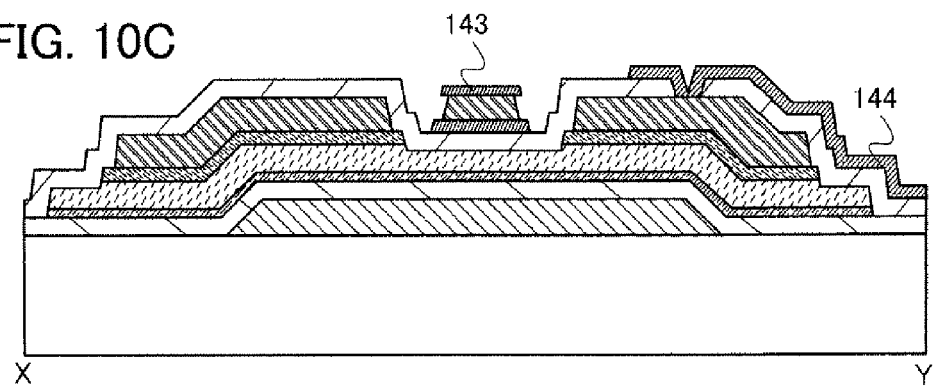

FIGS. 10A and 10B are each a top view of the thin film transistor connected to the pixel electrode illustrated in FIGS. 9A and 9B. FIG. 10A illustrates the case where a second gate electrode 143A is arranged independently without being connected to a first gate electrode. In FIG. 10A, the potential of the second gate electrode can be set independently of the potential of the first gate electrode. As described thus, the second gate electrode 143A and a pixel electrode 144A are preferably formed as different layers through different steps.

FIG. 10B illustrates the case where a second gate electrode 143B is connected to a first gate electrode. The second gate electrode 143B and the first gate electrode are connected to each other through an opening 140B. In FIG. 10B, the potential of the second gate electrode is equal to the potential of the first gate electrode and it is therefore difficult to set the potential of the second gate electrode independently of the potential of the first gate electrode. However, the second gate electrode 143B and a pixel electrode 144B can be formed as the same layer through the same steps.

The thin film transistor on which the steps up to the formation of the pixel electrode layer are completed as above can also be used for a light-emitting device (including an EL display device). In this case, the aforementioned pixel electrode layer serves as a lower electrode (a first electrode) and an upper electrode (a second pixel electrode) is provided over the lower electrode. An organic material layer including a light-emitting layer is interposed between the upper electrode and the lower electrode. In this case, one of or both the upper electrode and the lower electrode may be formed from a material having a light-transmitting property.

For example, in the case where only the lower electrode is formed from a material having a light-transmitting property, the light-emitting device has a bottom emission structure in which light is emitted downward from the light-emitting layer. Alternatively, in the case where only the upper electrode is formed from a material having a light-transmitting property, the light-emitting device has a top emission structure in which light is emitted upward from the light-emitting layer. Further alternatively, in the case where each of the lower electrode and the upper electrode is formed from a material having a light-transmitting property, the light-emitting device has a dual emission structure in which light is emitted downward and upward from the light-emitting layer. Any of these structures may be employed.

As described thus, the thin film transistor which can be used for the display device illustrated in any of FIGS. 9A and 9B and FIGS. 10A and 10B can be manufactured. As described in Embodiment 2, the second gate electrode and the pixel electrode of the thin film transistor which can be used for the display device of Embodiment 2 can be formed at the same time; therefore, the second gate electrode layer can be formed without increasing the number of steps.

(Embodiment 3)

Embodiment 3 describes a thin film transistor according to an embodiment of the present invention and its manufacturing method.

FIG. 11 illustrates an example of a thin film transistor according to an embodiment of the present invention. The thin film transistor illustrated in FIG. 11 includes a first gate electrode layer 202 over a substrate 200, a semiconductor layer 208 over the first gate electrode layer 202, a first gate insulating layer 204 between the first gate electrode layer 202 and the semiconductor layer 208, source electrode and drain electrode layers 212 provided over the semiconductor layer 208 with layers (impurity semiconductor layers 210) having ohmic contact with the semiconductor layer 208 interposed between the layers 212 and the semiconductor layer 208, a conductive layer 206 covered by the first gate insulating layer 204 and the semiconductor layer 208 in a region overlapping with part of the first gate electrode layer 202, a second gate insulating layer 214 provided so as to cover at least a back channel portion of the semiconductor layer 208, and a second gate electrode layer 216 overlapping with the back channel portion of the semiconductor layer 208 over the second gate insulating layer 214. Further, the conductive layer 206 is separated into two regions in a place that does not overlap with the source electrode and drain electrode layers 212, one of the two regions overlaps with one of the source electrode and drain electrode layers 212, and the other of the two regions overlaps with the other of the source electrode and drain electrode layers 212.

A substrate similar to the substrate 100 in Embodiment 1 may be used as the substrate 200.

As the first gate electrode layer 202, a layer similar to the first gate electrode layer 102 in Embodiment 1 may be used.

As the first gate insulating layer 204, a layer similar to the first gate insulating layer 104 in Embodiment 1 may be used.

The conductive layer 206 is formed from a conductive material, preferably from a microcrystalline semiconductor, particularly preferably from a microcrystalline semiconductor including an impurity element imparting one conductivity type. By the use of a microcrystalline semiconductor including an impurity element imparting one conductivity type as the conductive layer 206, ohmic contact between the conductive layer 206 and the semiconductor layer 208 to be formed later becomes possible in the case where the semiconductor layer 208 is formed from an amorphous semiconductor.

The semiconductor layer 208 is formed as a buffer layer, and a layer similar to the semiconductor layer 108 in Embodiment 1 may be used.

In the case where the conductive layer 206 is formed from a microcrystalline semiconductor, the formation of an amorphous semiconductor layer (preferably including hydrogen, nitrogen, or halogen) as the semiconductor layer 208 can prevent native oxidation of a surface of a crystal grain of a microcrystalline semiconductor layer. In particular, stress concentrates in a region where the amorphous semiconductor is in contact with a microcrystal grain in the microcrystalline semiconductor layer and a crack easily happens. If the crack is exposed to oxygen, the crystal grain is oxidized, so that a silicon oxide layer is formed. However, when the amorphous semiconductor layer is formed on a surface of the microcrystalline semiconductor layer, oxidation of the crystal grain can be prevented. Therefore, defects which trap carriers can be decreased and a region where carrier movement is interrupted can be made small. Accordingly, high-speed operation of the thin film transistor becomes possible and the amount of on current can be increased.

As the conductive layer 206, a semiconductor layer including nitrogen or an NH group and having a crystalline region in an amorphous structure may be provided instead of the microcrystalline semiconductor, in a manner similar to the semiconductor layer 106 in Embodiment 1.

Further, as the semiconductor layer 208, a semiconductor layer including nitrogen or an NH group and having a crystalline region in an amorphous structure may be provided in a manner similar to the semiconductor layer 108 in Embodiment 1.

Note that an amorphous semiconductor layer may be additionally provided as another buffer layer between the conductive layer 206 and the semiconductor layer 208. By the additional provision of the buffer layer between the conductive layer 206 and the semiconductor layer 208, it is possible to prevent mixture of substances and the like that degrade the electrical characteristics of the conductive layer 206 in the manufacturing process.

The impurity semiconductor layers 210 are provided between the semiconductor layer 208 and the source electrode and drain electrode layers 212 and may be formed through a process similar to that in Embodiment 1. Therefore, the impurity semiconductor layers 210 are not necessarily formed.

The source electrode and drain electrode layers 212 may be formed in a manner similar to the source electrode and drain electrode layers 112 in Embodiment 1.

The second gate insulating layer 214 may be formed in a manner similar to the second gate insulating layer 114 in Embodiment 1.

The second gate electrode layer 216 may be formed in a manner similar to the second gate electrode layer 116 in Embodiment 1. By the provision of the second gate electrode layer 216, the threshold voltage of the thin film transistor can be controlled.

Figure 12A:
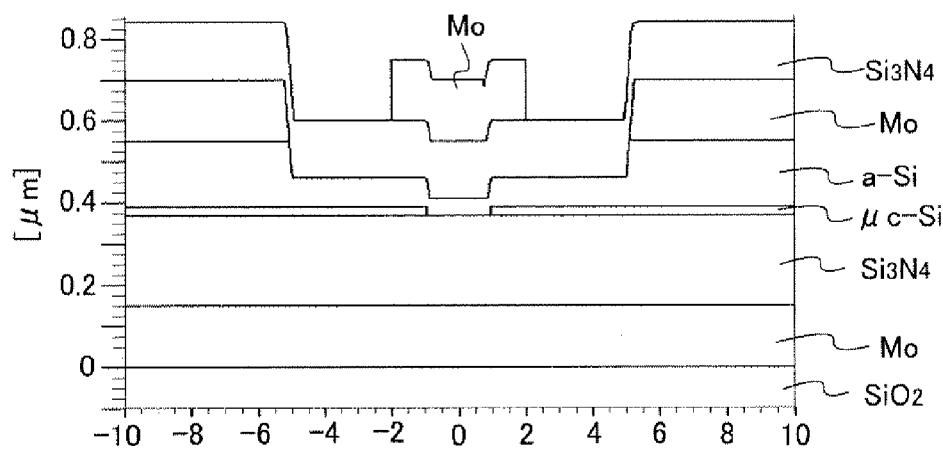
FIGS. 12A to 12C each illustrate a structure of an example of a thin film transistor used for calculation.
Figure 12B:
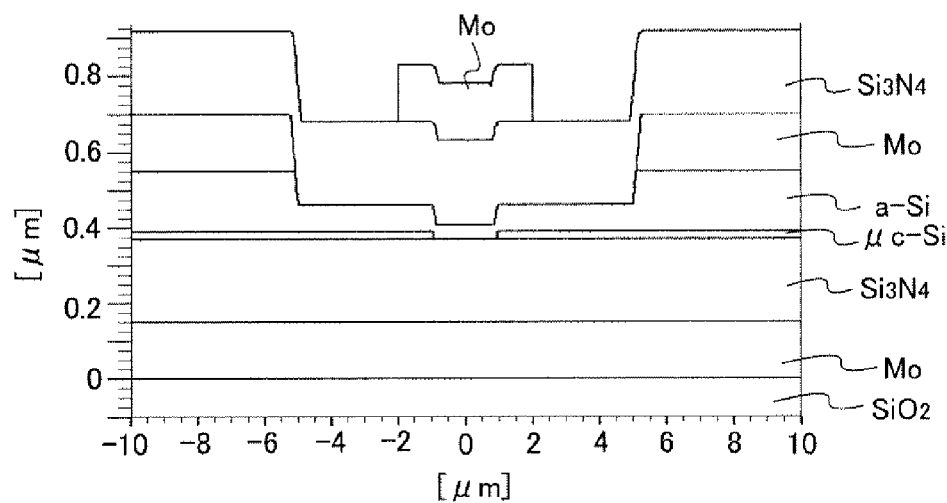
Figure 12C:
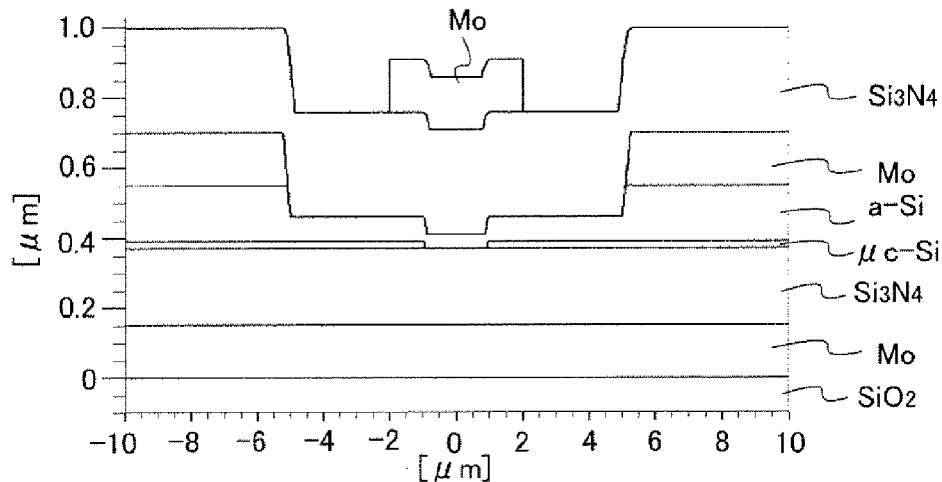

Here, a thin film transistor with a structure similar to that of the thin film transistor illustrated in FIG. 11 is described with reference to results of calculation. The structures used in the calculation are illustrated in FIGS. 12A to 12C. FIGS. 12A to 12C are different from each other only in the thickness of the second gate insulating layer.

The details of the thin film transistor used in the calculation are as follows. The channel length was 10 µm and the channel width was 1.0 µm. The first gate electrode layer was formed from molybdenum with a thickness of 150 nm. The first gate insulating layer was formed from silicon nitride with a thickness of 220 nm. The conductive layer was formed to have a two-layer structure where the lower layer of the conductive layer was formed from microcrystalline silicon with a thickness of 20 nm including phosphorus as an impurity element imparting one conductivity type at a concentration of $1.0 \times 10^{19}$ cm$^{-3}$ and the upper layer of the conductive layer was formed from amorphous silicon with a thickness of 30 nm. The buffer layer was formed similarly from amorphous silicon with a thickness of 80 nm, where the uppermost surface of the back channel portion was positioned at a depth of 40 nm from the boundary between the buffer layer and the impurity semiconductor layer. That is, the amorphous silicon was etched by 40 nm in a channel etching step. For the convenience of the calculation, the concentration of the impurity element imparting one conductivity type (phosphorus) in the amorphous semiconductor layer was set at $1.0 \times 10^{14}$ cm$^{-3}$. As the impurity semiconductor layer, amorphous silicon including an impurity element imparting one conductivity type was formed with a thickness of 50 nm and phosphorus was included as the impurity element imparting one conductivity type at a concentration of $1.0 \times 10^{19}$ cm$^{-3}$. As for the source electrode and drain electrode layers, the use of ideal metal which has an internal resistance of 0 and which has ohmic contact with the impurity semiconductor layer was assumed. The second gate insulating layer was formed from silicon nitride with a thickness of 140 nm (see FIG. 12A), 220 nm (see FIG. 12B), or 300 nm (see FIG. 12C). The second gate electrode layer was formed from molybdenum with a thickness of 100 nm. The work function of molybdenum was assumed 4.53 eV. The distance between the conductive layers provided apart from each other was 2.0 µm.

Note that the current value is expressed with the unit A/µm in the calculation results shown below because the calculation was made two dimensionally. That is, the current value is the amount of current when the channel length is per unit length.

Figure 13A:
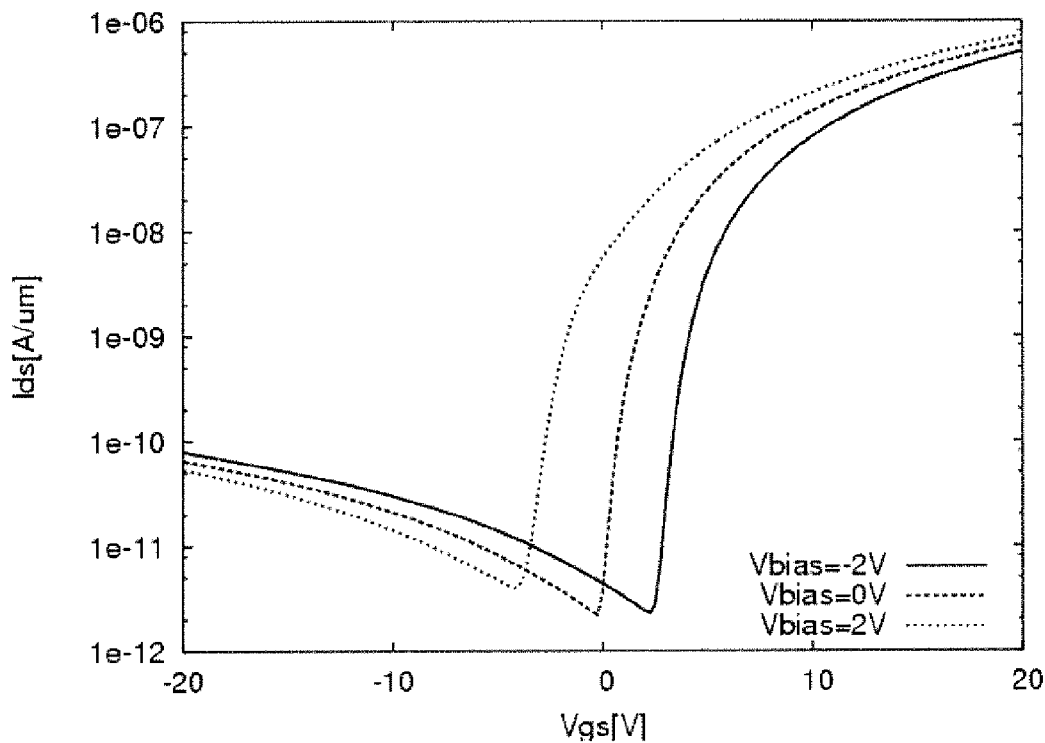
FIGS. 13A and 13B illustrate results of the calculation on the structures illustrated in FIGS. 12A to 12C.

FIG. 13A shows curves (Vg-Id curves) indicating the results of first calculation, where the horizontal axis indicates a gate voltage (a difference in potential between a gate and a source when the potential of the source is a reference potential) of the first gate electrode layer, which is changed from −20 V to 20 V, and the vertical axis indicates a drain current (a current flowing between the source and the drain). In the first calculation, a drain voltage (a difference in potential between the drain and the source when the potential of the source is a reference potential) was fixed at 10 V and the thickness of the second gate insulating layer was 140 nm.

According to FIG. 13A, the Vg-Id curves shift negatively as a bias voltage (a difference in potential between the source and the second gate electrode when the potential of the source is a reference potential) of the second gate electrode is increased to be −2 V, 0 V, and 2 V; therefore, the threshold voltage also shifts negatively. Accordingly, when a positive bias voltage is applied to the second gate electrode, a normally-off thin film transistor is obtained; when a negative bias voltage is applied to the second gate electrode, a normally-on thin film transistor is obtained.

Figure 13B:
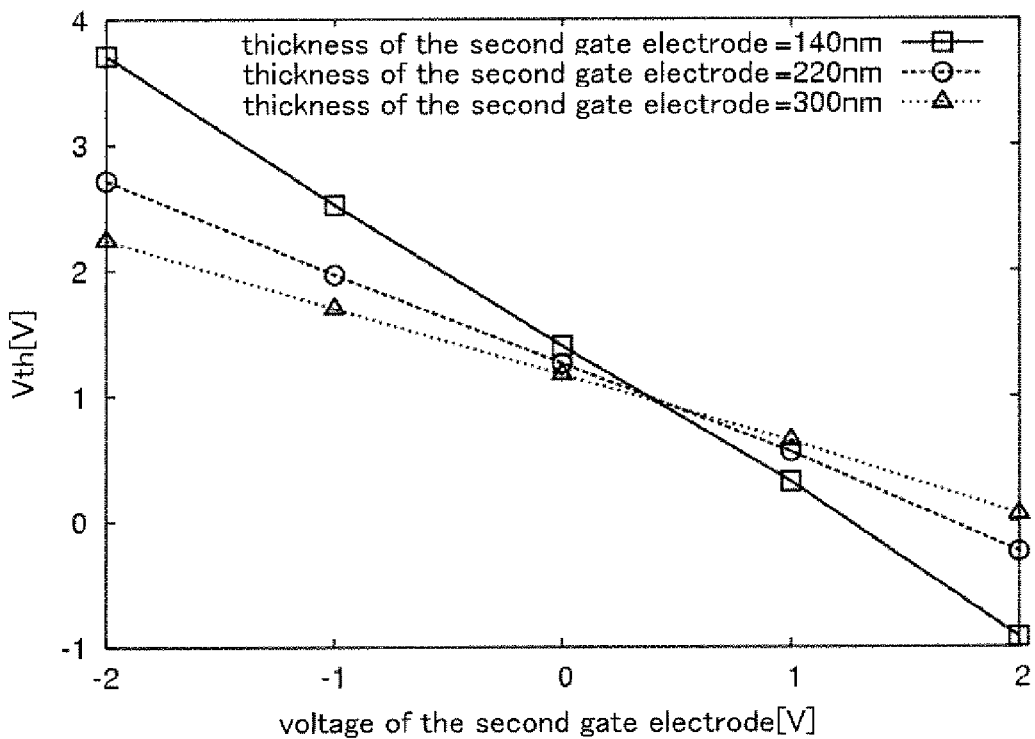

FIG. 13B is a graph indicating the results of second calculation, where the horizontal axis indicates the bias voltage which is changed to −2 V, −1 V, 0 V, 1 V, and 2 V and the vertical axis indicates the threshold voltage. In the second calculation, a drain voltage (a difference in potential between the source and the drain when the potential of the source is a reference potential) was fixed at 10 V and the thickness of the second gate insulating layer was set to 140 nm, 220 nm, and 300 nm.

According to FIG. 13B, the threshold voltage shifts negatively as the bias voltage applied to the second gate electrode is increased. In this case, as the second gate insulating layer becomes thinner, the amount of change in threshold voltage due to the change in bias voltage applied to the second gate electrode layer increases. Therefore, in the case where the thin film transistor is operated while the threshold voltage is significantly changed, the second gate insulating layer is preferably thin. In such a case, the second gate insulating layer preferably has a thickness greater than or equal to 140 nm and less than or equal to 220 nm.

However, in the case where the bias voltage applied to the second gate electrode needs to be controlled accurately, the second gate insulating layer is preferably formed thick. In this case, the second gate insulating layer preferably has a thickness greater than or equal to 220 nm and less than or equal to 300 nm.

Each of FIGS. 14A and 14B and FIGS. 15A and 15B is a graph indicating the results of third calculation, where the horizontal axis indicates the gate voltage applied to the first gate electrode and the vertical axis indicates the drain current. In the third calculation, the drain voltage (a difference in potential between the source and the drain when the potential of the source is a reference potential) was fixed at 10 V; the thickness of the second gate insulating layer was 220 nm; the bias voltage of the second gate electrode ranged from −2 V to 2 V or was equal to the potential of the first gate electrode (Vbias=Vgs). Note that a certain bias voltage in each of FIGS. 14A and 14B and FIGS. 15A and 15B is expressed as "a"; when Vgs is smaller than a, Vbias is equal to a; when Vgs is larger than or equal to a, Vbias is equal to Vgs.

Figure 14A:
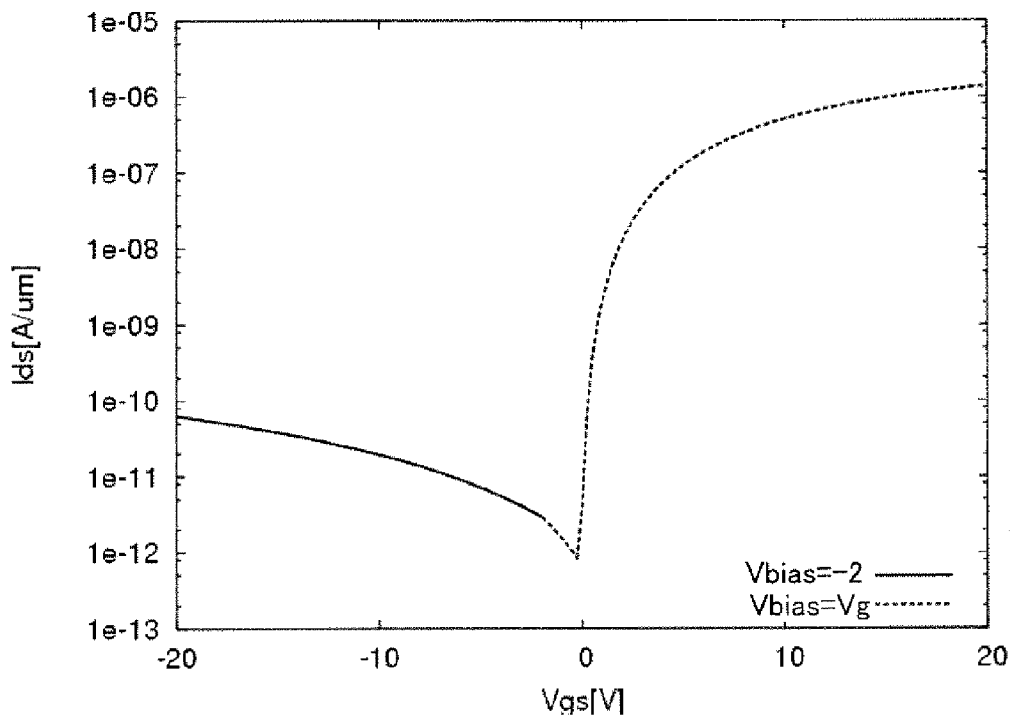
FIGS. 14A and 14B illustrate results of the calculation on the structures illustrated in FIGS. 12A to 12C.
Figure 14B:
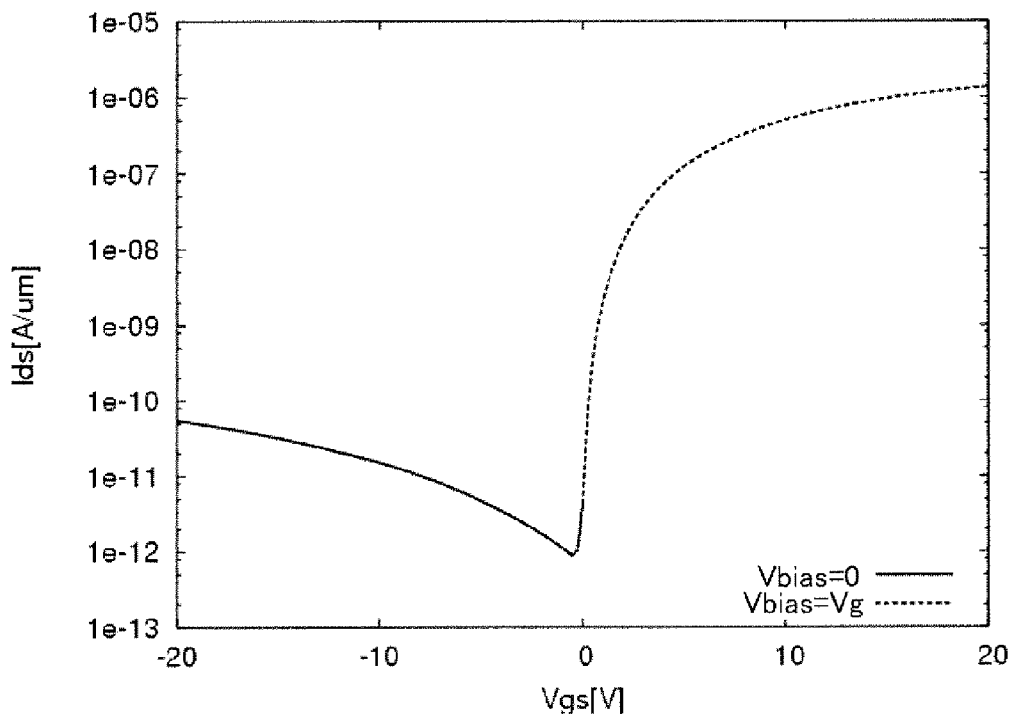
Figure 15A:
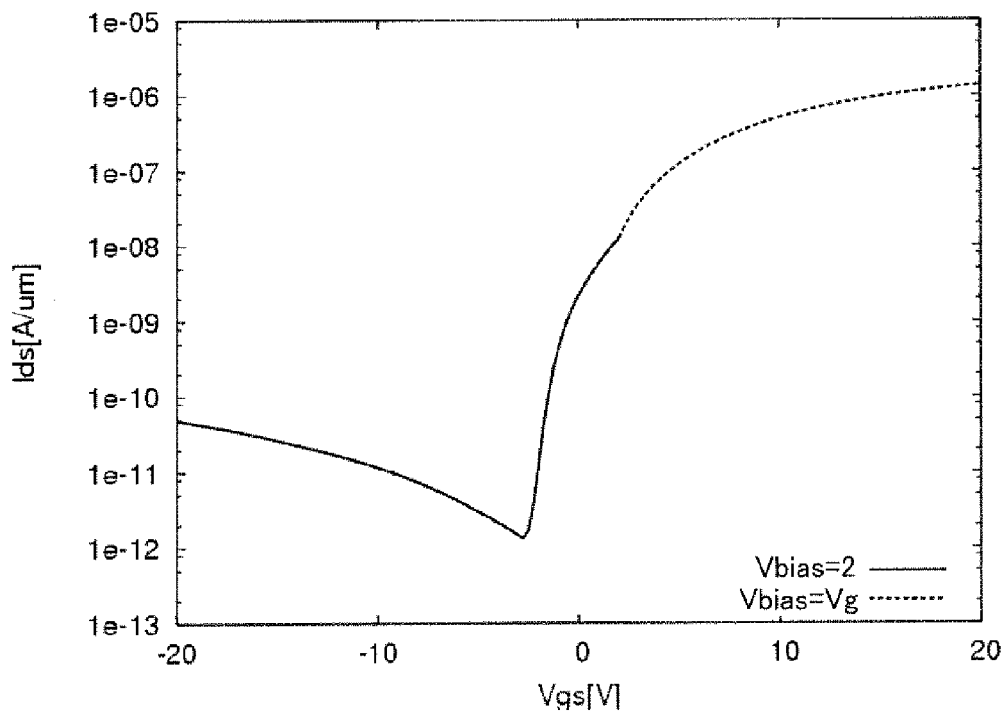
FIGS. 15A and 15B illustrate results of the calculation on the structures illustrated in FIGS. 12A to 12C.
Figure 15B:
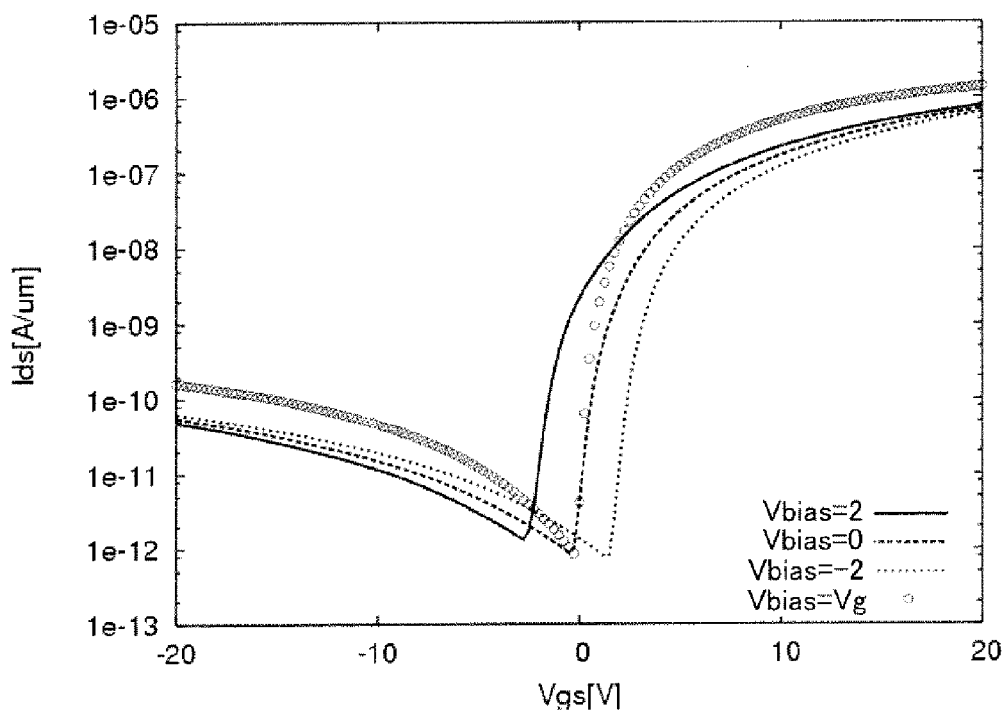

More specifically, FIG. 14A shows a curve (Vg-Id curve) in which when Vgs is smaller than −2 V, Vbias is equal to −2 V, and when Vgs is larger than or equal to −2 V, Vbias is equal to Vgs. FIG. 14B indicates a curve (Vg-Id curve) in which when Vgs is smaller than 0 V, Vbias is equal to 0 V, and when Vgs is larger than or equal to 0 V, Vbias is equal to Vgs. FIG. 15A indicates a curve (Vg-Id curve) in which when Vgs is smaller than 2 V, Vbias is equal to 2 V, and when Vgs is larger than or equal to 2 V, Vbias is equal to Vgs. FIG. 15B shows curves when Vbias is equal to −2 V, 0 V, 2 V, or Vgs.

According to FIG. 15B, the amount of drain current is larger in the case where Vbias is equal to Vgs as compared to the case where Vbias is equal to −2 V, 0 V, or 2V, and the amount of on current and the amount of off current are also high in the former case. Therefore, when the thin film transistor is on, Vbias is set to be equal to Vgs and when the thin film transistor is off, Vbias is kept constant. In this manner, the amount of on current can be increased and the amount of off current can be decreased, so that the switching characteristic of the thin film transistor can be improved. Note that the control as above is possible by a driver circuit, specifically by connecting the second gate electrode to a wiring which is different from a wiring to which the first gate electrode is connected.

Each of FIGS. 16A and 16B, FIGS. 17A and 17B, and FIG. 18 is a graph indicating the results of fourth calculation regarding the change in threshold voltage with respect to the position of the second gate electrode layer when the drain voltage (a difference in potential between the source and the drain when the potential of the source is a reference potential) was fixed at 10 V, the thickness of the second gate insulating layer was 140 nm, and the bias voltage of the second gate electrode layer ranged from −2 V to 2 V. Note that the deviation of the position of the second gate electrode layer from the center between the source and the drain is expressed as Δx; the deviation toward the source is expressed with minus and the deviation toward the drain is expressed with plus.

Figure 16A:
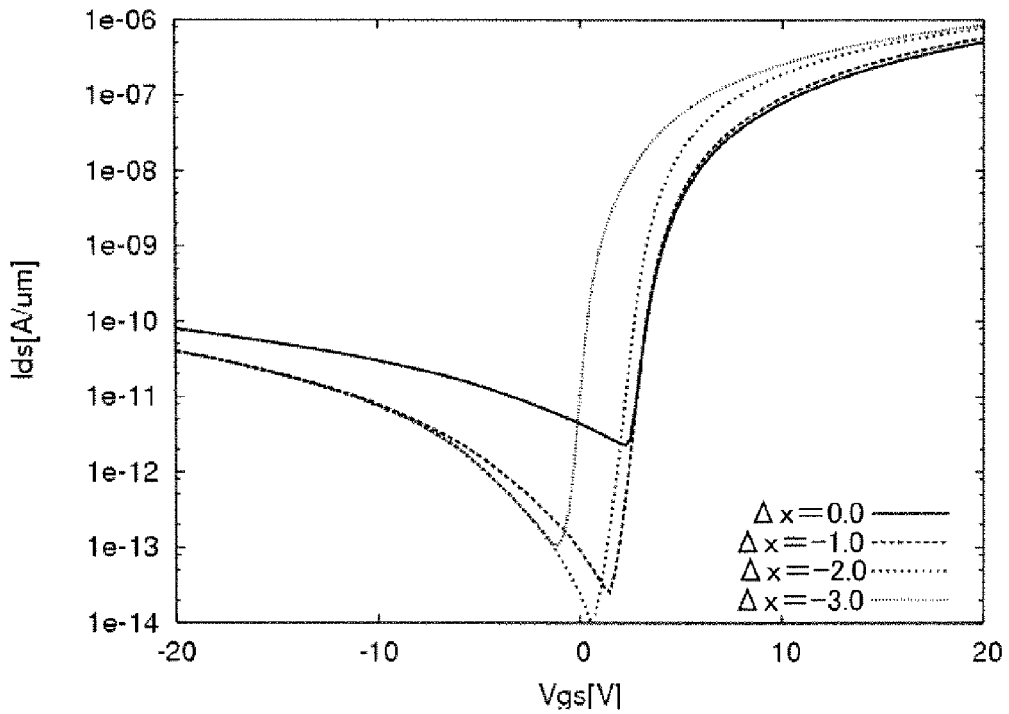
FIGS. 16A and 16B illustrate results of the calculation on the structures illustrated in FIGS. 12A to 12C.
Figure 16B:
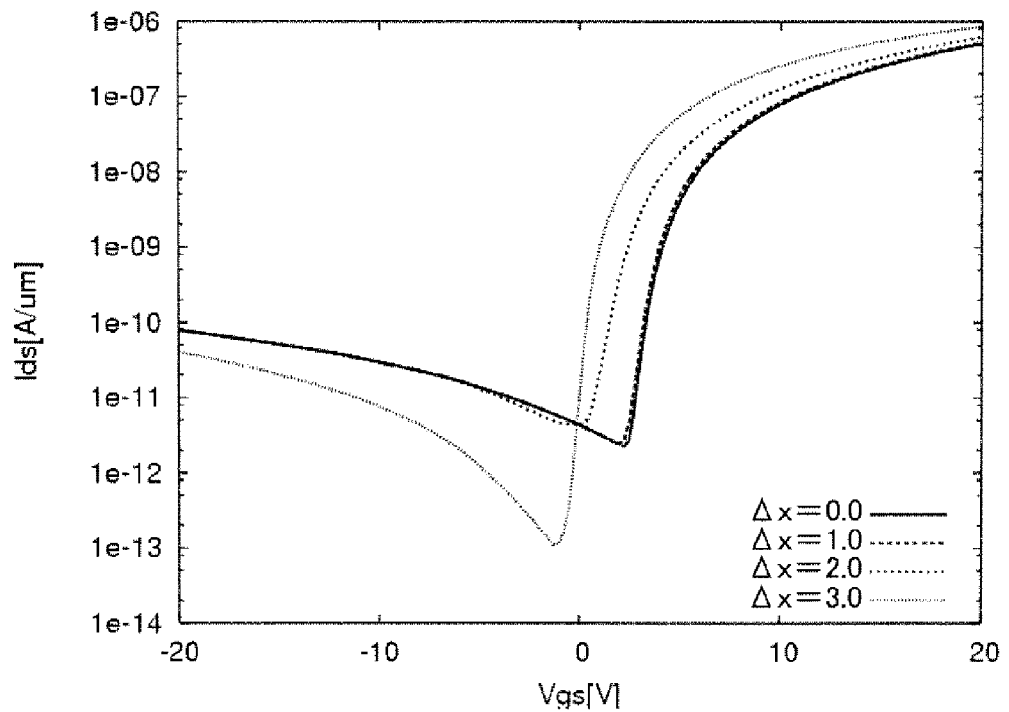
Figure 17A:
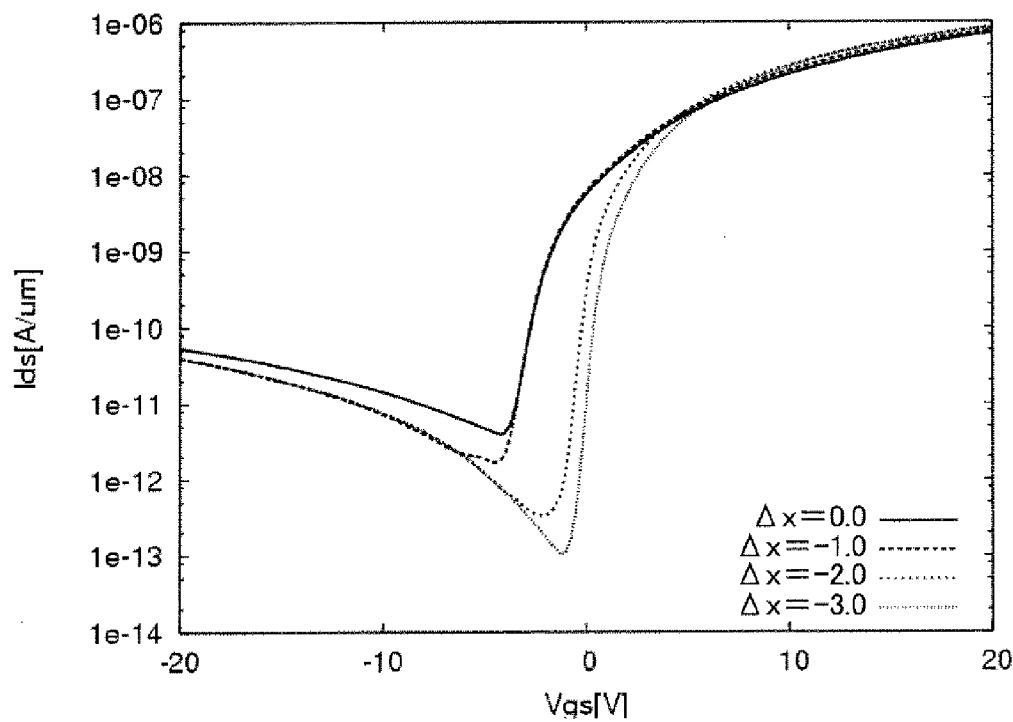
FIGS. 17A and 17B illustrate results of the calculation on the structures illustrated in FIGS. 12A to 12C.
Figure 17B:
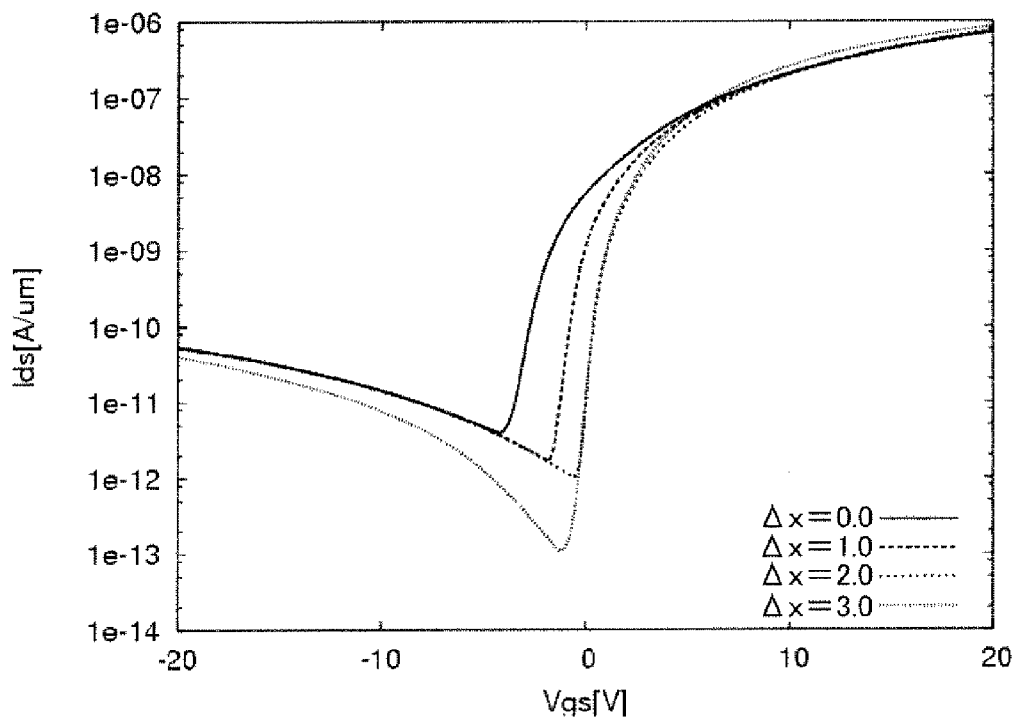

Specifically, FIG. 16A shows curves (Vg-Id curves) where the horizontal axis indicates the gate voltage (a difference in potential between the source and the gate when the potential of the source is a reference potential) of the first gate electrode, which is changed from −20 V to 20 V and the vertical axis indicates the drain current (current flowing between the source and the drain), in the case where the bias voltage of the second gate electrode is −2 V and the position of the second gate electrode layer is moved by 0 μm, 1 μm, 2 μm, and 3 μm toward the source. On the other hand, FIG. 16B shows curves (Vg-Id curves) where the horizontal axis indicates the gate voltage (a difference in potential between the source and the gate when the potential of the source is a reference potential) of the first gate electrode, which is changed from −20 V to 20 V and the vertical axis indicates the drain current (current flowing between the source and the drain), in the case where the bias voltage of the second gate electrode is −2 V and the position of the second gate electrode layer is moved by 0 μm, 1 μm, 2 μm, and 3 μm toward the drain. In FIG. 17A, the bias voltage applied to the second gate electrode in FIG. 16A is 2 V. In FIG. 17B, the bias voltage applied to the second gate electrode in FIG. 16B is 2 V. FIG. 18 shows the results of FIGS. 16A and 16B and FIGS. 17A and 17B, where the horizontal axis indicates the position of the second gate electrode and the vertical axis indicates the change in threshold voltage.

FIG. 18 shows that the change in threshold voltage depending on the position of the second gate electrode is small when Vbias is greater than or equal to 0 V and less than or equal to 1 V. Therefore, when Vbias is greater than or equal to 0 V and less than or equal to 1 V in the operation, the threshold voltage is not easily affected by the position of the second gate electrode and the variation in threshold voltage with respect to the deviation in position of the second gate electrode can be made small.

Next, an example of a method for manufacturing the thin film transistor illustrated in FIG. 11 is described with reference to FIGS. 19A to 19C, FIGS. 20A to 20C, FIGS. 21A to 21C, FIGS. 22A to 22C, and FIGS. 23A and 23B.

First, a conductive layer used for the first gate electrode layer 202 is formed over the substrate 200 by a sputtering method, a CVD method, or the like and patterned by a photolithography process or the like. After that, a resist mask is removed.

Figure 19A:
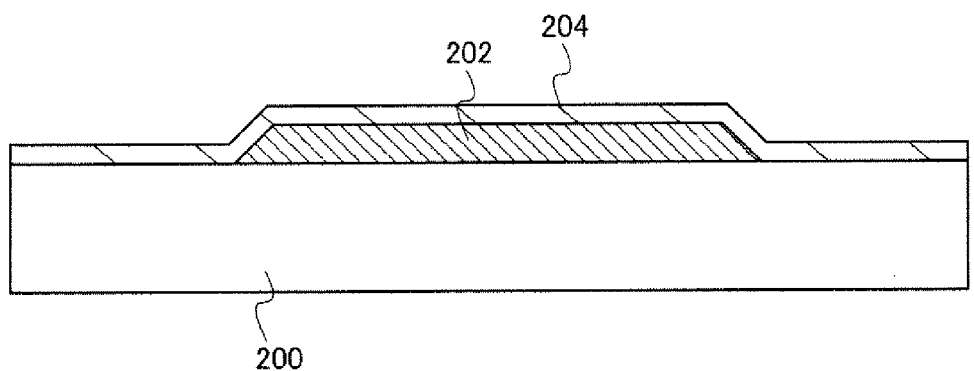
FIGS. 19A to 19C illustrate an example of a process for manufacturing a thin film transistor.

Next, the first gate insulating layer 204 is formed so as to cover the first gate electrode layer 202 (see FIG. 19A).

Figure 19B:
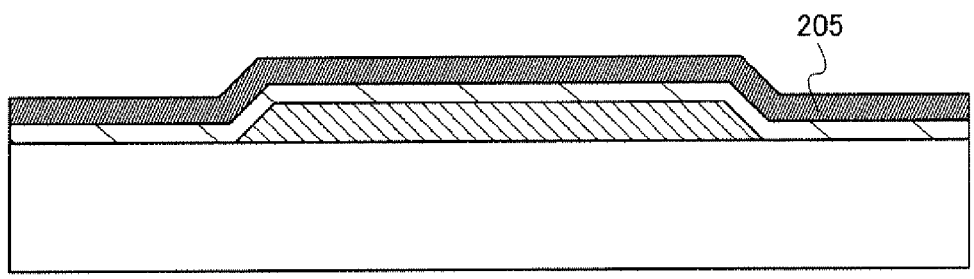
Figure 19C:
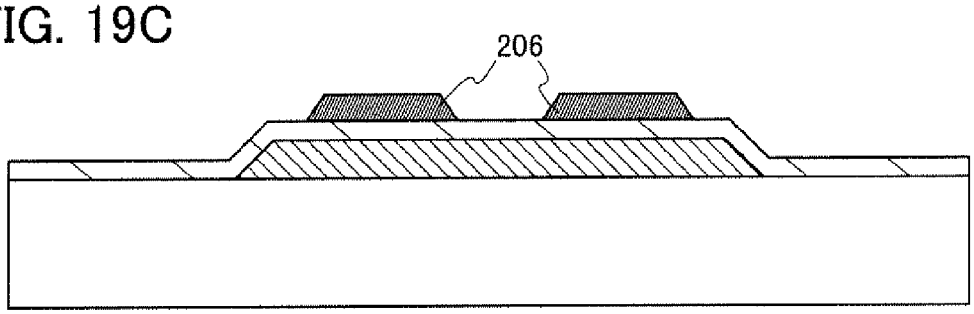

Next, the conductive layer 205 is formed over the first gate insulating layer 204 by a sputtering method, a CVD method, or the like (see FIG. 19B). After that, the conductive layer 205 is patterned by a photolithography process or the like, whereby the conductive layer 206 is formed. After that, a resist mask is removed (see FIG. 19C).

Note that a buffer layer may be further formed over the conductive layer 206 as described above. That is, a buffer layer may be further formed between the conductive layer 206 and the semiconductor layer 208. In this case, a stack of the conductive layer 206 and the buffer layer formed further may be etched collectively. By the further formation of the buffer layer in this manner, it is possible to prevent the mixture of substances and the like (here, the residue of the resist mask and the like) that degrade the electrical characteristics of the conductive layer 206.

Figure 20A:
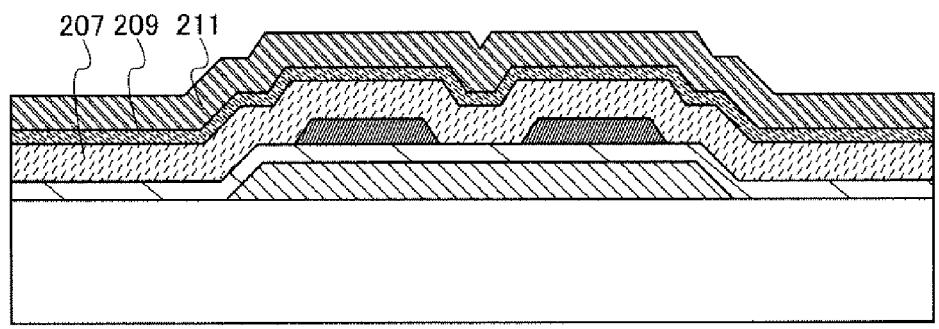
FIGS. 20A to 20C illustrate an example of a process for manufacturing a thin film transistor.
Figure 20B:
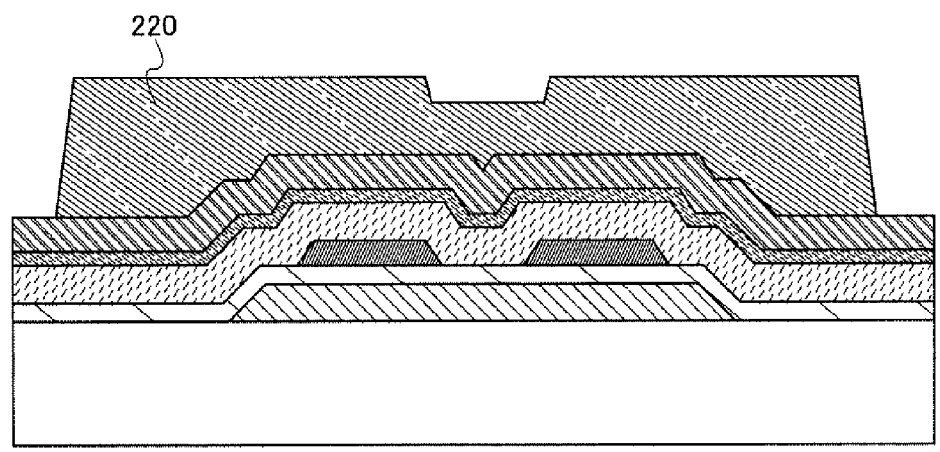

Next, a semiconductor layer 207 used for the semiconductor layer 208, an impurity semiconductor layer 209 used for the impurity semiconductor layers 210, and a conductive layer 211 used for the source electrode and drain electrode layers 212 are stacked in that order so as to cover the conductive layer 206 (see FIG. 20A). After that, a first resist mask 220 is formed thereover (see FIG. 20B).

The first resist mask 220 is a resist mask having a depressed portion or a projecting portion. In other words, the first resist mask 220 has a plurality of regions (here, two regions) with different thicknesses. A region of the first resist mask 220, which has large thickness, is referred to as a projecting portion of the first resist mask 220. A region of the first resist mask 220, which has small thickness, is referred to as a depressed portion of the first resist mask 220.

In the first resist mask 220, the projecting portion is formed in a region where the source and drain electrode layers 212 are to be formed and the depressed portion is formed in a region where the semiconductor layer is exposed without existence of the source and drain electrode layers 212.

The first resist mask 220 can be formed using a common multi-tone mask. Here, as the multi-tone mask, the mask described in Embodiment 1 with reference to FIGS. 7A to 7D can be used. By light exposure using the multi-tone mask and development, the first resist mask 220 which includes regions having different thicknesses can be formed.

Figure 20C:
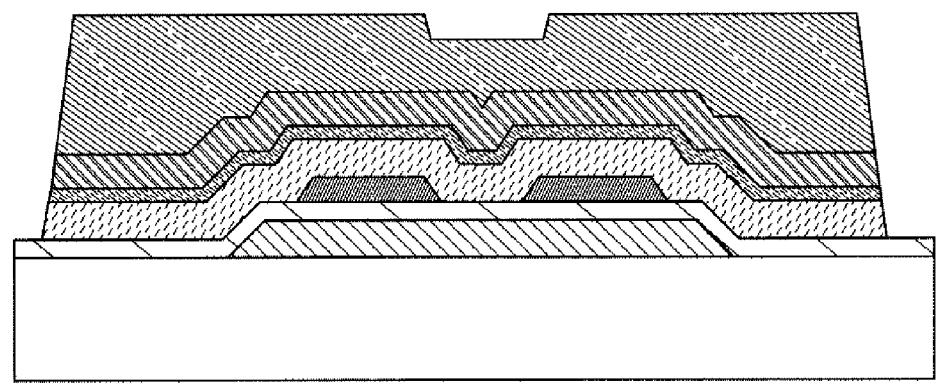

Next, the semiconductor layer, the impurity semiconductor layer, and the conductive layer are etched using the first resist mask 220 (see FIG. 20C).

Figure 21A:
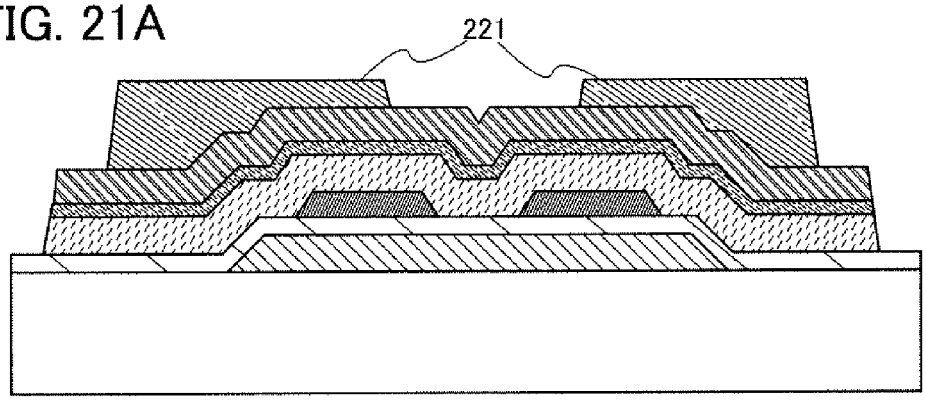
FIGS. 21A to 21C illustrate an example of a process for manufacturing a thin film transistor.

Next, the first resist mask 220 is decreased in size so that the conductive layer in a region overlapping with the depressed portion of the first resist mask 220 is exposed, whereby a second resist mask 221 is formed (see FIG. 21A). As a way for forming the second resist mask 221 by decreasing the first resist mask 220 in size, for example, ashing using oxygen plasma can be given. However, the way for forming the second resist mask 121 by decreasing the first resist mask 120 in size is not limited to the above ashing.

Figure 21B:
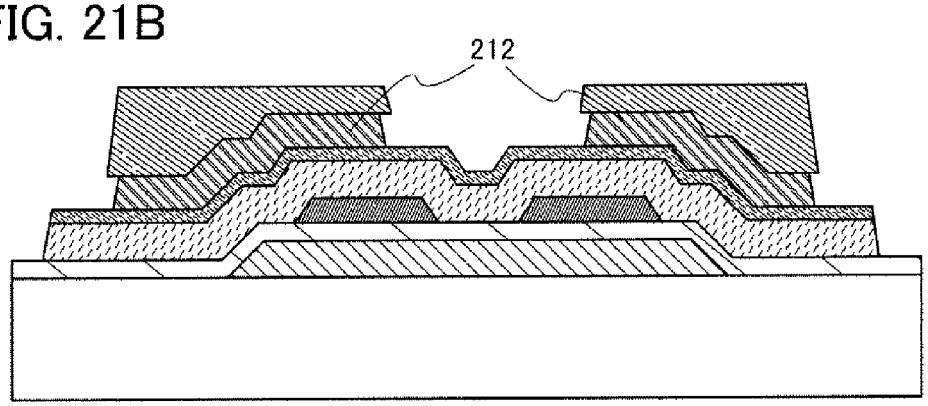

Next, the conductive layer is etched using the second resist mask 221, whereby the source electrode and drain electrode layers 212 are formed (see FIG. 21B). Here, the etching can be performed by dry etching or wet etching; wet etching is preferable. This is because the distance between the source electrode and the drain electrode can be increased by the wet etching.

Figure 21C:
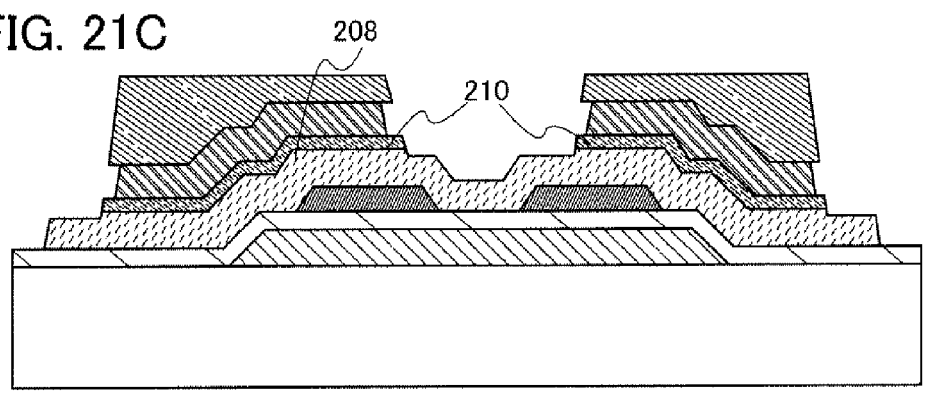

Next, an upper part of the semiconductor layer and the impurity semiconductor layer are etched using the second resist mask 221 (see FIG. 21C). Here, the etching can be performed by dry etching or wet etching; dry etching is preferable. This is because the dry etching makes possible the processing at high accuracy. Here, by etching part of the semiconductor layer, a back channel portion is formed. After that, the second resist mask 221 is removed (see FIG. 22A).

Note that after removal of the second resist mask 121, it is preferable to perform etching for the purpose of removing a residue and the like in the back channel portion in a manner similar to Embodiment 1. This etching step is performed while the semiconductor layer 208 and the like are exposed; therefore, the etching is performed preferably under the condition where the etching rate of the exposed semiconductor layer 208 is low and the surface to be etched is not easily damaged.

Furthermore, after the etching performed for the purpose of removing the residue and the like in the back channel portion, plasma process is preferably performed while the back channel portion is exposed, in a manner similar to Embodiment 1.

For example, in the case where $H_2O$ plasma is used in the plasma process performed while the back channel portion is exposed, this plasma process may be performed before the removal of the second resist mask 221. In this case, the second resist mask 221 can be removed by the plasma process.

Figure 22A:
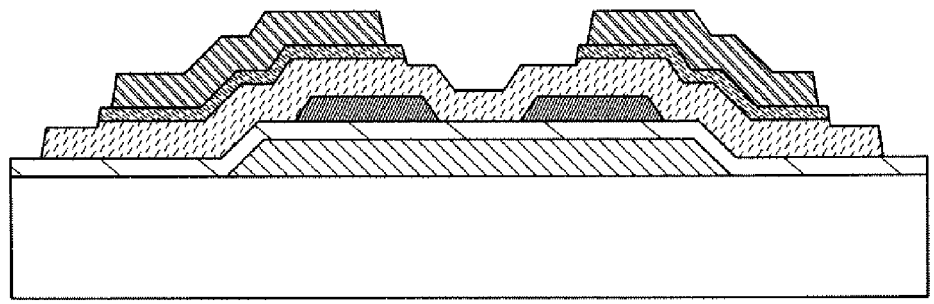
FIGS. 22A to 22C illustrate an example of a process for manufacturing a thin film transistor.
Figure 22B:
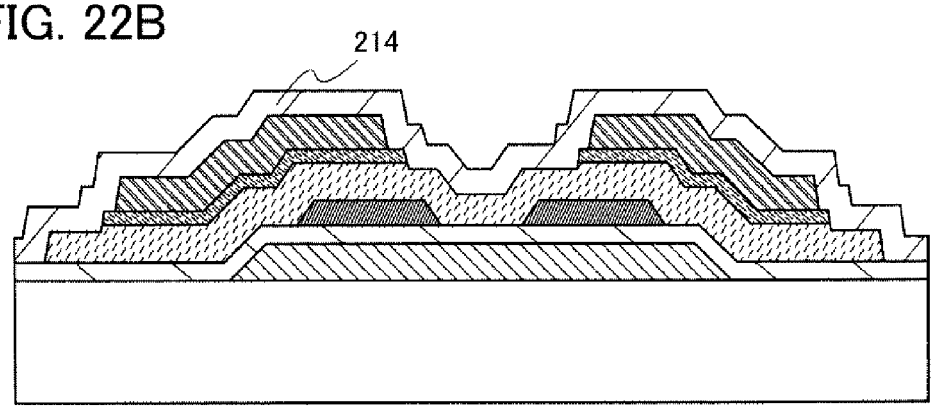

Next, the second gate insulating layer 214 is formed so as to cover at least the semiconductor layer 208, the impurity semiconductor layers 210, and the source electrode and drain electrode layers 212 (see FIG. 22B).

Figure 22C:
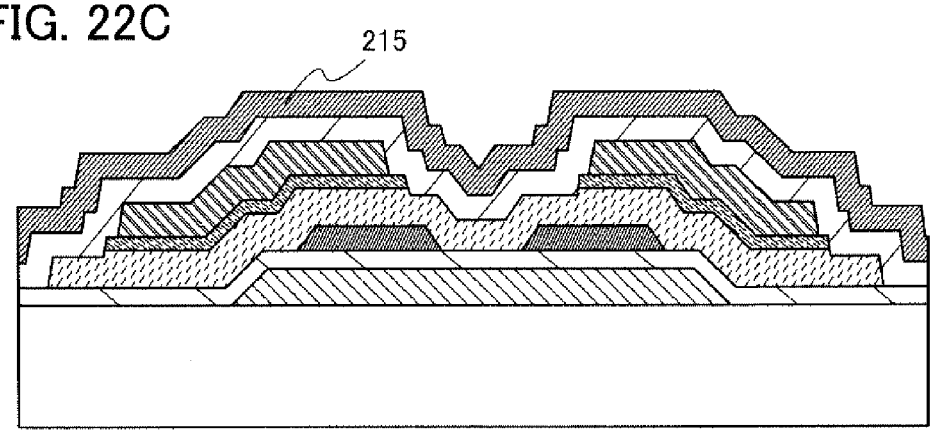
Figure 23A:
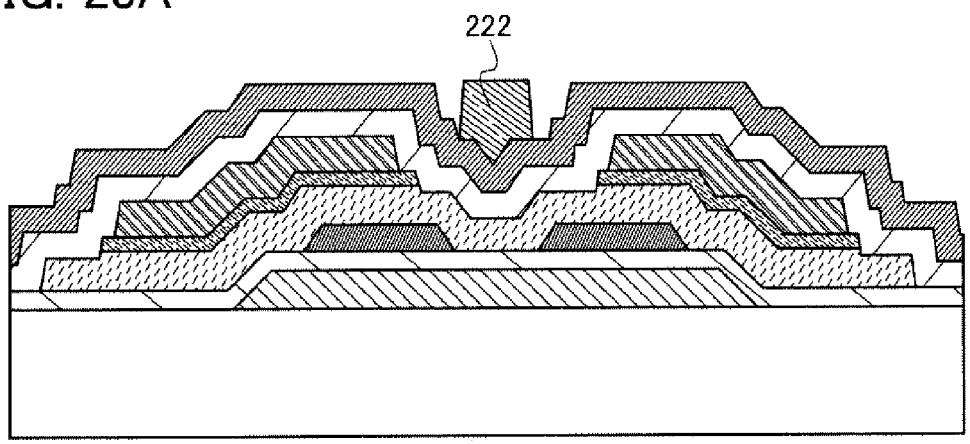
FIGS. 23A and 23B illustrate an example of a process for manufacturing a thin film transistor.
Figure 23B:
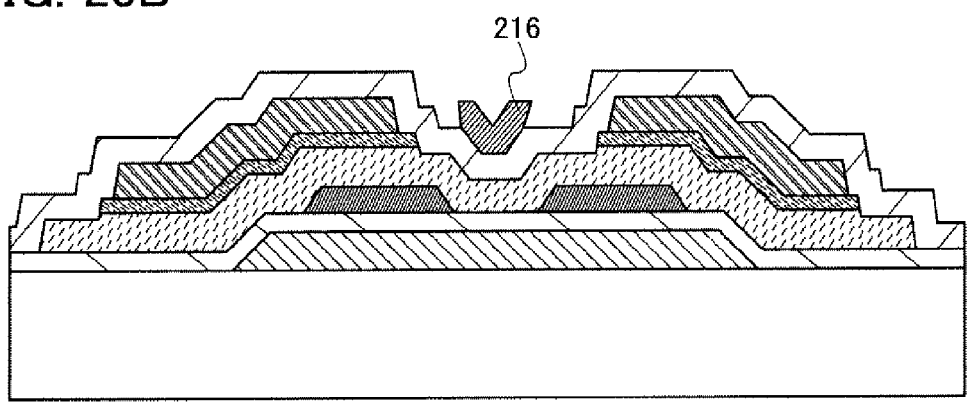

Next, a conductive layer 215 used for the second gate electrode layer 216 is formed over the second gate insulating layer 214 (see FIG. 22C). Then, a third resist mask 222 is formed over the conductive layer 215 (see FIG. 23A). After that, etching is performed using the third resist mask 222, whereby the second gate electrode layer 216 is formed; then, the third resist mask 222 is removed (see FIG. 23B).

In the manner as above, the thin film transistor illustrated in FIG. 11 can be obtained.

(Embodiment 4)

The thin film transistor described in Embodiment 3 can be used for a display device. In the case of using the thin film transistor for a display device, the second gate electrode is preferably formed at the same time as a pixel electrode layer. This is because when the second gate electrode is formed using the pixel electrode layer, the second gate electrode can be provided without increasing the number of steps. In Embodiment 4, a method for manufacturing a display device according to an embodiment of the present invention is described.

Figure 24A:
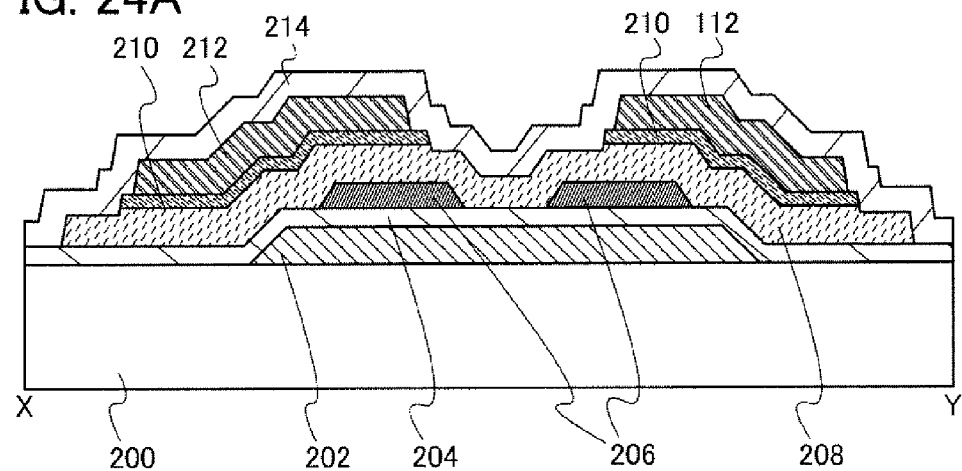
FIGS. 24A to 24C illustrate an example of a process for manufacturing a display device.

First, the steps up to the formation of the second gate insulating layer 214 are completed in a manner similar to Embodiment 3 (see FIG. 24A).

Figure 24B:
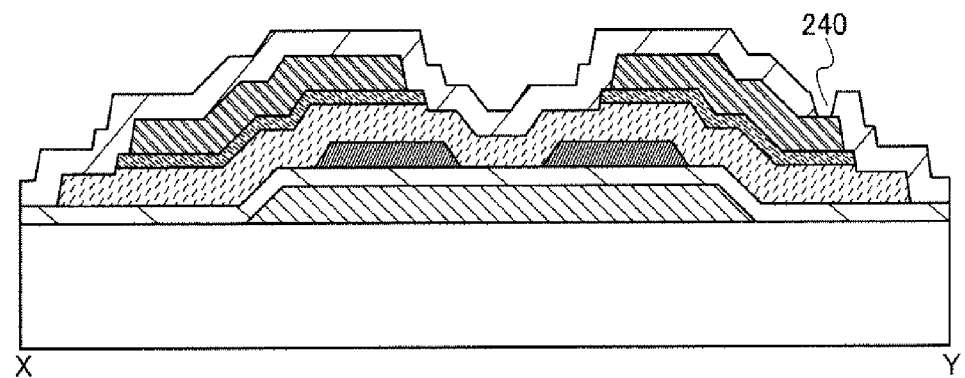

Next, the second gate insulating layer 214 is provided with an opening 240 (see FIG. 24B). The opening 240 is provided so that a drain electrode and a pixel electrode are connected to each other therein. The opening 240 can be formed by a photolithography process.

Figure 24C:
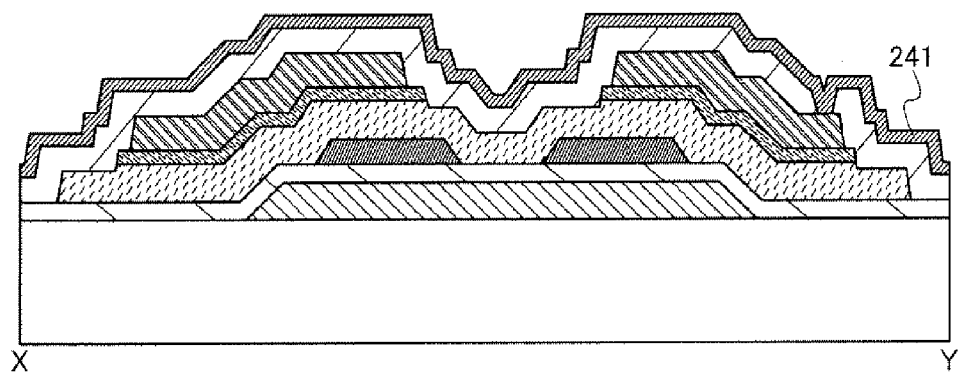

Next, a conductive layer 241 used for the pixel electrode is formed over the second gate insulating layer 214 (see FIG. 24C). Then, resist masks 242 are formed over the conductive layer 241 (see FIG. 25A). The resist masks 242 are provided so as to overlap with the position of the second gate electrode and the position of the pixel electrode.

Note that in the case of a transmissive liquid crystal display device or a top-emission light-emitting device, the conductive layer 241 is formed from a conductive material having a light-transmitting property in a manner similar to the conductive layer 141 in Embodiment 1.

Next, the conductive layer 241 is etched using the resist masks 242, whereby a second gate electrode 243 and a pixel electrode 244 are formed. After that, the resist masks 242 are removed (see FIG. 25B).

As above, the thin film transistor on which the steps up to the formation of the pixel electrode layer are completed can be applied to a liquid crystal display device.

Note that when the second gate electrode is formed using the pixel electrode layer, sufficiently low resistivity cannot be obtained, so that wiring delay occurs in some cases. Therefore, even in the case where the thin film transistor is used for a display device, when the second gate electrode needs to have sufficiently low resistivity, a layer used for the second gate electrode is preferably formed separately. Here, the case where the second gate electrode needs to have sufficiently low resistivity refers to, for example, the case where the potential of the second gate electrode and the potential of the first gate electrode need to be different from each other.

In the case where the second gate electrode is formed separately, for example, a three-layer structure in which an aluminum layer is sandwiched between barrier layers is preferable. Here, as the barrier layer, for example, a molybdenum layer or a titanium layer is used. A manufacturing process in the case where a titanium layer is used is briefly described below. Note that the pixel electrode layer is formed from ITO.

First, a titanium layer, an aluminum layer, and a titanium layer are stacked in that order over the second gate insulating layer. Next, a resist mask is formed over the stack of these metal layers and the metal layers are etched using the resist mask, whereby a pattern of the second gate electrode is formed. Here, it is preferable to use an etchant by which the etching rate of aluminum is higher than that of titanium in the etching so that the aluminum layer sufficiently recedes inward. This is for the purpose of preventing oxidation of aluminum because when aluminum and ITO are in contact with each other, aluminum is oxidized. Therefore, the etching is preferably wet etching; for example, the wet etching employs an etchant including nitric acid, acetic acid, and phosphoric acid which are composed so as to make the etching rate of aluminum higher than that of titanium. After the etching, the resist mask is removed. FIG. 26C illustrates the thin film transistor formed in this manner.

Next, an ITO layer is formed over the second gate insulating layer and the second gate electrode which has been patterned, and a resist mask is formed over the ITO layer. Then, etching is performed on the ITO layer, so that a pattern of the pixel electrode is formed using ITO. After that, the resist mask is removed.

As described thus, the second gate electrode can be formed from a material different from the material of the pixel electrode layer.

Figure 25A:
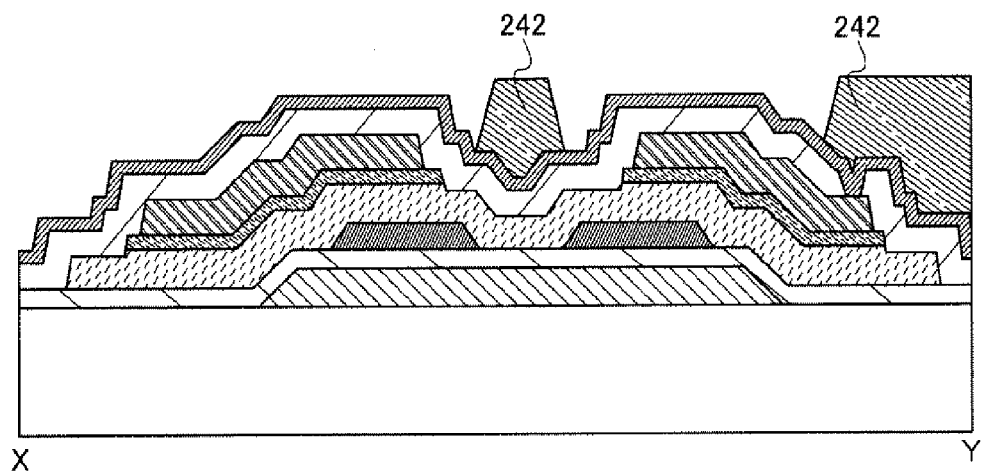
FIGS. 25A and 25B illustrate an example of a process for manufacturing a display device.
Figure 25B:
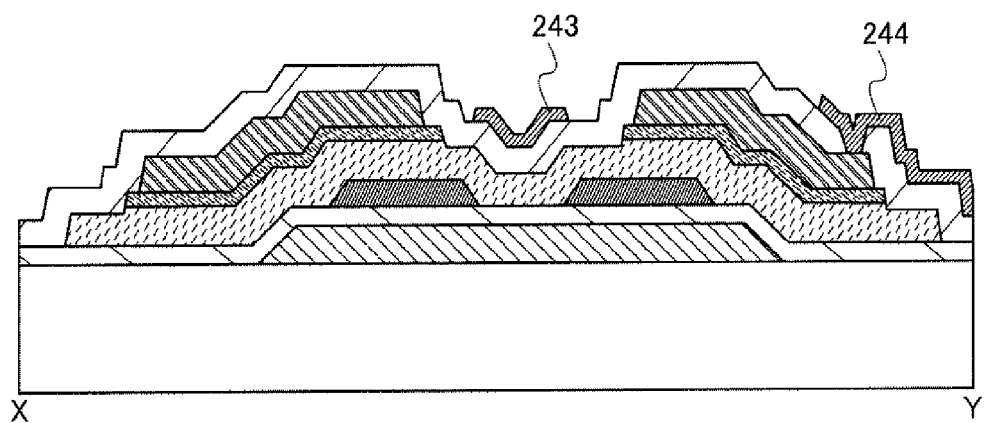
Figure 26A:
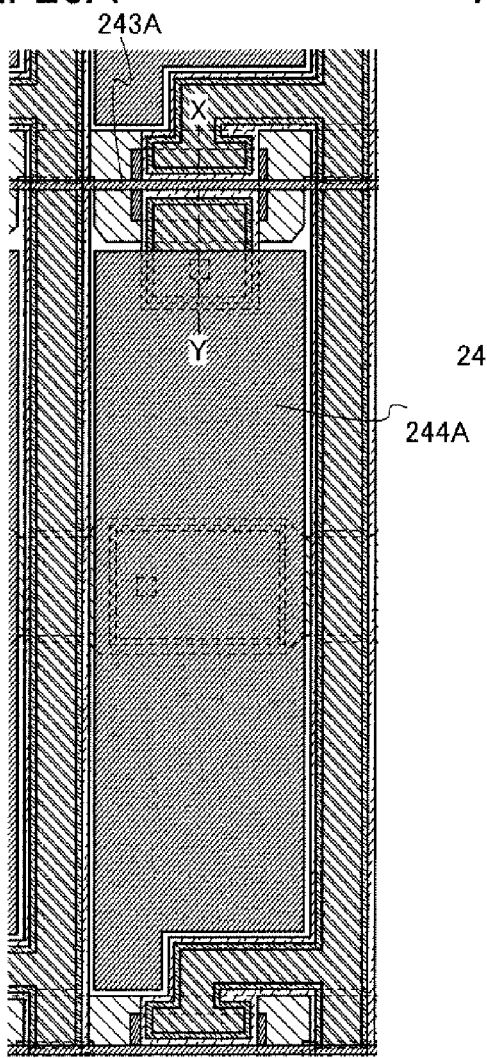
FIGS. 26A to 26C illustrate examples of a thin film transistor used for a display device.
Figure 26B:
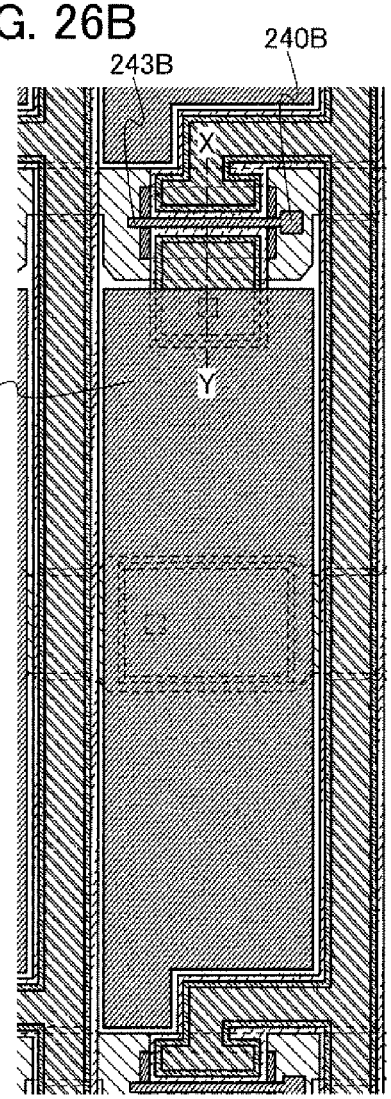
Figure 26C:
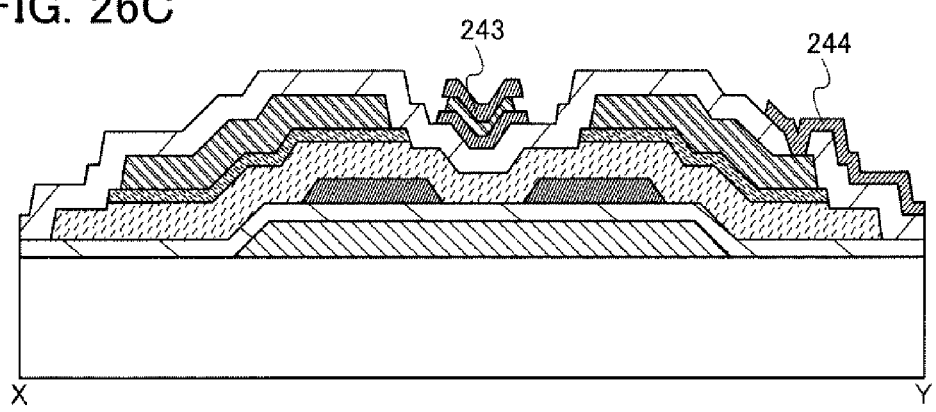

FIGS. 26A and 26B are each a top view of the thin film transistor connected to the pixel electrode illustrated in FIGS. 25A and 25B. FIG. 26A illustrates the case where a second gate electrode 243A is arranged independently without being connected to the first gate electrode. In FIG. 26A, the potential of the second gate electrode can be set independently of the potential of the first gate electrode. As described thus, the second gate electrode 243A and a pixel electrode 244A are preferably formed as different layers through different steps.

FIG. 26B illustrates the case where the second gate electrode 243B is connected to the first gate electrode. The second gate electrode 243B and the first gate electrode are connected to each other through an opening 240B. In FIG. 26B, the potential of the second gate electrode becomes equal to the potential of the first gate electrode and it is therefore difficult to set the potential of the second gate electrode independently of the potential of the first gate electrode. However, the second gate electrode 243B and the pixel electrode 244B can be formed as the same layer through the same steps.

In both FIGS. 26A and 26B, a conductive layer and the like are preferably provided at a portion where a gate wiring formed using the first gate electrode layer intersects with a source wiring formed using the source electrode and drain electrode layers. When the conductive layer 206 and the like are provided at the portion where the wirings intersect with each other, parasitic capacitance between the wirings can be suppressed and wiring delay and the like can be prevented.

Note that the thin film transistor on which the steps up to the formation of the pixel electrode layer are completed as above can also be used for a light-emitting device (including an FL display device). In this case, the aforementioned pixel electrode layer serves as a lower electrode (a first electrode) and an upper electrode (a second pixel electrode) is provided over the lower electrode. An organic material layer including a light-emitting layer is interposed between the upper electrode and the lower electrode. In this case, one of or both the upper electrode and the lower electrode may be formed from a material having a light-transmitting property.

For example, in the case where only the lower electrode is formed from a material having a light-transmitting property, the light-emitting device has a bottom-emission structure in which light is emitted downward from the light-emitting layer. Alternatively, in the case where only the upper electrode is formed from a material having a light-transmitting property, the light-emitting device has a top-emission structure in which light is emitted upward from the light-emitting layer. Further alternatively, in the case where each of the lower electrode and the upper electrode is formed from a material having a light-transmitting property, the light-emitting device has a dual-emission structure in which light is emitted downward and upward from the light-emitting layer. Any of these structures may be employed.

As described thus, the thin film transistor which can be used for the display device as illustrated in any of FIGS. 25A and 25B and FIGS. 26A and 26B can be manufactured. As described in Embodiment 4, the second gate electrode and the pixel electrode of the thin film transistor which can be used for the display device of Embodiment 4 can be formed at the same time; therefore, the second gate electrode layer can be formed without increasing the number of steps.

(Embodiment 5)

Embodiment 5 describes a thin film transistor having a structure different from those described in Embodiment 3 and Embodiment 4. The thin film transistor of Embodiment 5 is different from those of Embodiment 3 and Embodiment 4 in structure.

Figure 27A:
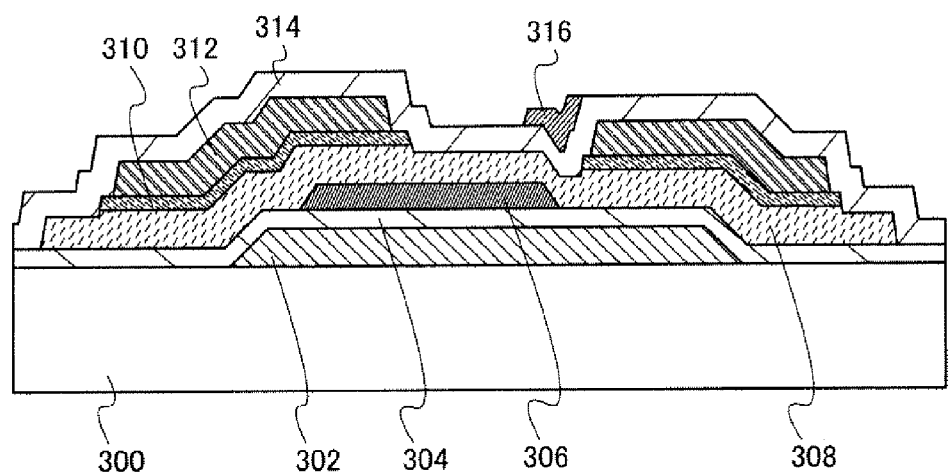
FIGS. 27A and 27B each illustrate an example of a thin film transistor.
Figure 27B:
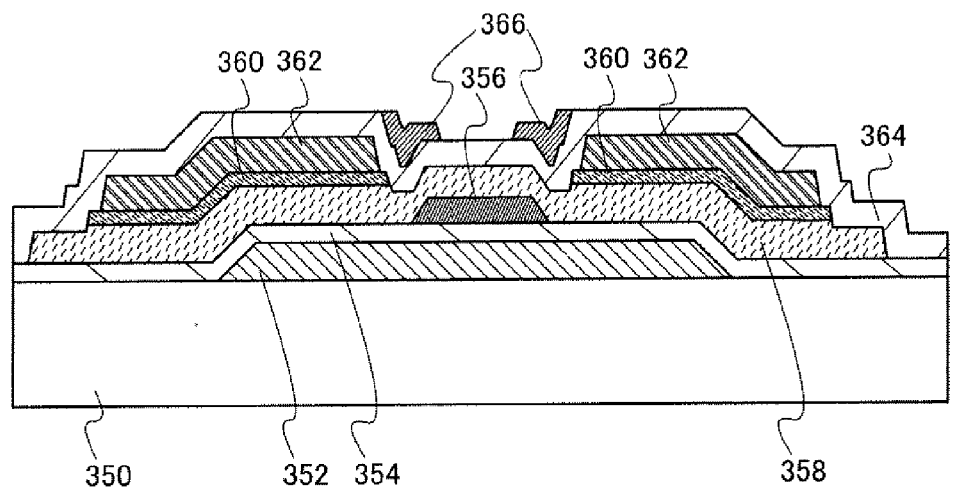

FIGS. 27A and 27B illustrate thin film transistors.

Each of FIGS. 27A and 27B illustrates an example of a thin film transistor. The thin film transistor illustrated in FIG. 27A includes a first gate electrode layer 302 over a substrate 300, a semiconductor layer 308 over the first gate electrode layer 302, a first gate insulating layer 304 between the first gate electrode layer 302 and the semiconductor layer 308, source electrode and drain electrode layers 312 provided over the semiconductor layer 308 with layers (impurity semiconductor layers 310) having ohmic contact with the semiconductor layer 308 interposed between the layers 312 and the semiconductor layer 308, a conductive layer 306 covered by the first gate insulating layer 304 and the semiconductor layer 308 in a region overlapping with part of the first gate electrode layer 302, a second gate insulating layer 314 provided so as to cover at least a back channel portion of the semiconductor layer 308, and a second gate electrode layer 316 overlapping with the back channel portion of the semiconductor layer 308 over the second gate insulating layer 314. Further, the conductive layer 306 overlaps with one of the source electrode and drain electrode layers and does not overlap with the other of the source electrode and drain electrode layers.

A substrate similar to the substrate 100 may be used as the substrate 300. As the first gate electrode layer 302, a layer formed using a material and a method which are similar to those of the first gate electrode layer 102 may be used. As the first gate insulating layer 304, a layer formed using a material and a method which are similar to those of the first gate insulating layer 104 may be used. As the conductive layer 306, a layer formed using a material and a method which are similar to those of the conductive layer 206 may be used. As the semiconductor layer 308, a layer formed using a material and a method which are similar to those of the semiconductor layer 108 may be used. As the impurity semiconductor layers 310, layers formed using a material and a method which are similar to those of the impurity semiconductor layers 110 may be used. As the source electrode and drain electrode layers 312, layers formed using a material and a method which are similar to those of the source electrode and drain electrode layers 112 may be used. As the second gate insulating layer 314, a layer formed using a material and a method which are similar to those of the second gate insulating layer 114 may be used. As the second gate electrode layer 316, a layer formed using a material and a method which are similar to those of the second gate electrode layer 116 may be used.

The thin film transistor illustrated in FIG. 27B includes a first gate electrode layer 352 over a substrate 350, a semiconductor layer 358 over the first gate electrode layer 352, a first gate insulating layer 354 between the first gate electrode layer 352 and the semiconductor layer 358, source electrode and drain electrode layers 362 provided over the semiconductor layer 358 with layers (impurity semiconductor layers 360) having ohmic contact with the semiconductor layer 358 interposed between the layers 362 and the semiconductor layer 358, a conductive layer 356 covered by the first gate insulating layer 354 and the semiconductor layer 358 in a region overlapping with part of the first gate electrode layer 352, a second gate insulating layer 364 provided so as to cover at least a back channel portion of the semiconductor layer 358, and a second gate electrode layer 366 overlapping with the back channel portion of the semiconductor layer 358 over the second gate insulating layer 364. The conductive layer 356 is provided so as not to overlap with the source electrode and drain electrode layers.

A substrate similar to the substrate 100 may be used as the substrate 350. As the first gate electrode layer 352, a layer formed using a material and a method which are similar to those of the first gate electrode layer 102 may be used. As the first gate insulating layer 354, a layer formed using a material and a method which are similar to those of the first gate insulating layer 104 may be used. As the conductive layer 356, a layer formed using a material and a method which are similar to those of the conductive layer 206 may be used. As the semiconductor layer 358, a layer formed using a material and a method which are similar to those of the semiconductor layer 108 may be used. As the impurity semiconductor layers 360, layers formed using a material and a method which are similar to those of the impurity semiconductor layers 110 may be used. As the source electrode and drain electrode layers 362, layers formed using a material and a method which are similar to those of the source electrode and drain electrode layers 112 may be used. As the second gate insulating layer 364, a layer formed using a material and a method which are similar to those of the second gate insulating layer 114 may be used. As the second gate electrode layer 366, a layer formed using a material and a method which are similar to those of the second gate electrode layer 116 may be used.

Figure 28A:
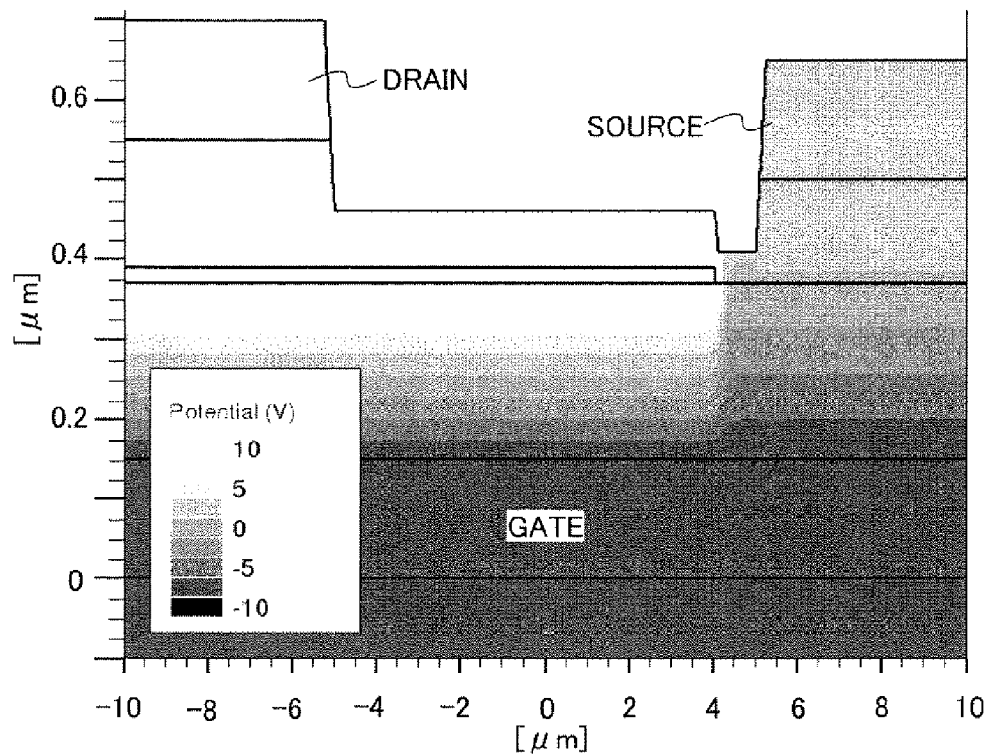
FIGS. 28A and 28B each illustrate a structure of an example of a thin film transistor used for calculation.
Figure 28B:
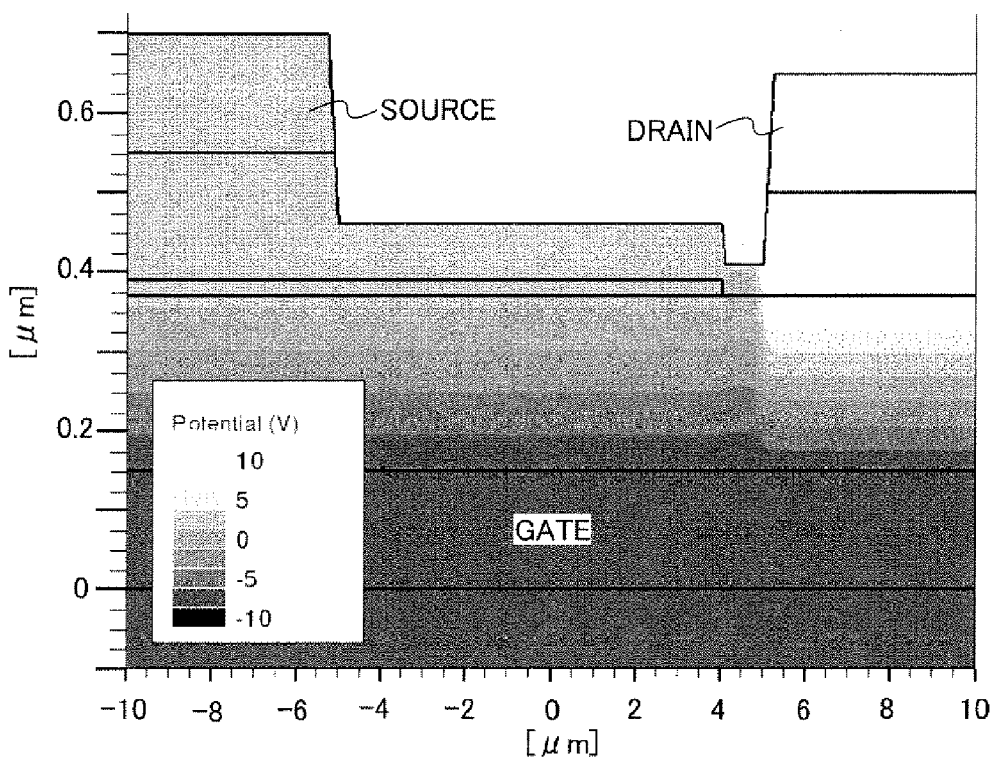
Figure 29:
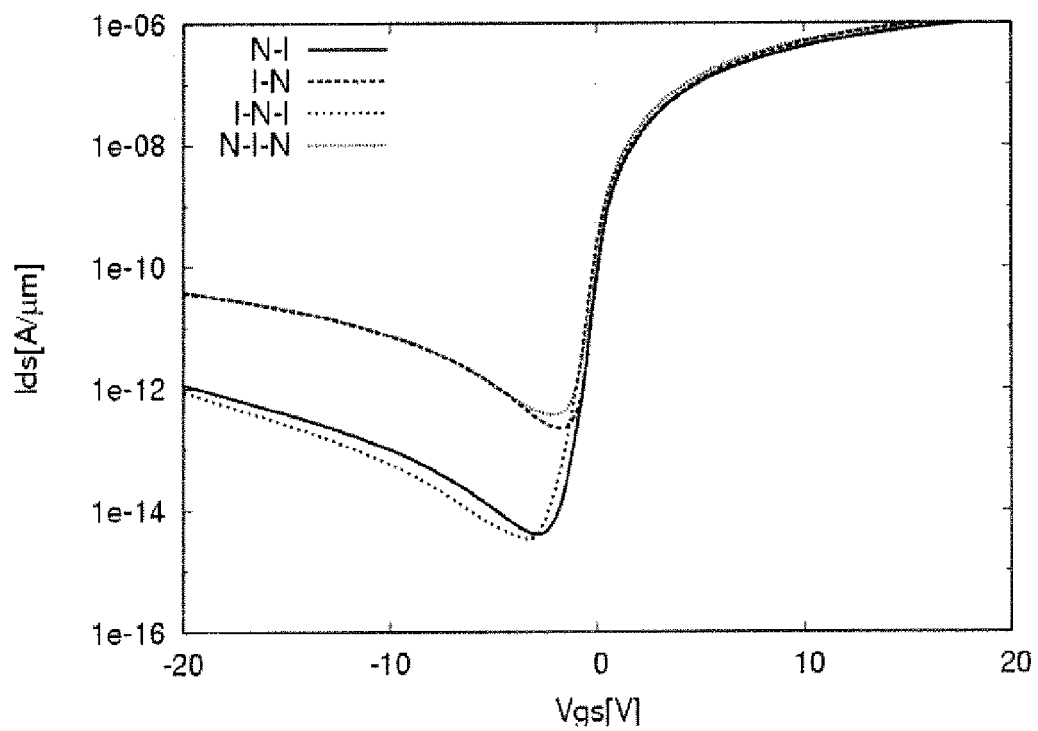
FIG. 29 illustrates a structure of an example of a thin film transistor used for calculation.

The thin film transistor illustrated in FIG. 11 and the thin film transistors illustrated in FIGS. 27A and 27B are different in structure. The difference in electrical characteristics due to the difference in structure is compared by calculation. FIGS. 28A and 28B each illustrate a structure of a thin film transistor used for the calculation. FIG. 29 shows curves (Vg-Id curves) where the horizontal axis indicates a gate voltage (a difference in potential between a source and a gate when the potential of the source is a reference potential), which is changed from −20 V to 20 V, and the vertical axis indicates a drain current (current flowing between a source and a drain). In FIG. 29, the structure of FIG. 27B is shown with a curve I-N-I, the structure of FIG. 11 is shown with a curve N-I-N, the structure of FIG. 27A is shown with a curve N-I and a curve I-N, a structure which includes a region where a conductive layer does not exist on a side closer to the drain is shown with the curve N-I, and a structure which includes a region where a conductive layer does not exist on a side closer to the source is shown with the curve I-N.

According to FIG. 29, the amount of off current is smaller in the structure which includes, in a manner similar to the thin film transistor with the structure illustrated in FIG. 27, a region where a conductive layer does not exist on a side closer to the drain than in the structure which includes, in a manner similar to the thin film transistor with the structure illustrated in FIG. 11, a region where a conductive layer does not exist in the center.

According to the comparison between the structure where the region without the conductive layer is located on the source side and the structure where the region without the conductive layer is located on the drain side, the amount of off current is smaller in the case where the region without the conductive layer is located on the drain side. When it is assumed that the potential hardly changes in the region overlapping with the conductive layer, the reason is considered as below.

In the case where the region without the conductive layer is located on the drain side (that is, the case where the conductive layer exists at the source side), the potential difference between the drain and the gate is large (Vd=10 V, Vg=−10 V) and the potential in a current path of an amorphous semiconductor layer is greatly changed. Therefore, the potential sufficiently changes in the current path of the amorphous semiconductor layer and an electric field does not concentrate on a particular region; accordingly, the amount of off current decreases.

On the other hand, in the case where the region without the conductive layer is formed on the source side (that is, in the case where the conductive layer exists on the drain side), the potential difference between the source and the gate is comparatively small (Vs=0 V, Vg=−10 V); therefore, the amount of change in potential in a current path of an amorphous semiconductor layer is small. Therefore, the potential does not sufficiently change in the current path and an electric field concentrates on a particular region; accordingly, the amount of off current increases. The amount of off current increases due to the similar reason in the structure which includes, in a manner similar to the thin film transistor with the structure illustrated in FIG. 11, a region where a conductive layer does not exist in the center.

Further, the thin film transistor illustrated in FIG. 27 can also be used for a display device as described in Embodiment 4.

As described thus, the structure of the thin film transistor according to an embodiment of the present invention is not limited to the structures described in Embodiment 3 and Embodiment 4.

(Embodiment 6)

Next, an example of a display panel or a light-emitting panel which includes the thin film transistor described in the above embodiment is described with reference to drawings.

FIG. 30 is a block diagram of a display device. The display device illustrated in FIG. 30 includes a pixel portion 400 including a plurality of pixels each provided with a display element, a scan line driver circuit 402 which selects each pixel, and a signal line driver circuit 404 which controls input of a video signal to a selected pixel.

Note that the display device is not limited to the structure shown in FIG. 30. That is, a signal line driver circuit used in the display device according to an embodiment of the present invention is not limited to the structure including only a shift register and an analog switch. In addition to the shift register and the analog switch, another circuit such as a buffer, a level shifter, or a source follower may be included. Further, the shift register and the analog switch are not necessarily provided. For example, another circuit such as a decoder circuit by which a signal line can be selected may be used instead of the shift register, or a latch or the like may be used instead of the analog switch.

The signal line driver circuit 404 illustrated in FIG. 30 includes a shift register 406 and an analog switch 408. A clock signal (CLK) and a start pulse signal (SP) are input to the shift register 406. When these signals are input, a timing signal is generated in the shift register 406 and input to the analog switch 408.

In addition, a video signal is supplied to the analog switch 408. The analog switch 408 samples the video signal in accordance with the input timing signal and supplies the sampled signal to a signal line of the next stage.

The scan line driver circuit 402 illustrated in FIG. 30 includes a shift register 410 and a buffer 412 and may include a level shifter. In the scan line driver circuit 402, when the clock signal (CLK) and the start pulse signal (SP) are input to the shift register 410, a selection signal is generated. The generated selection signal is buffered and amplified by the buffer 412, and the resulting signal is supplied to a corresponding scan line. Gates of transistors in pixels of one line are connected to one scan line. Further, since the transistors in the pixels of one line should be turned on at the same time in the operation, a buffer which can supply a large amount of current is used as the buffer 412.

Here, the scan line refers to a wiring connected to one of or both a first gate electrode and a second gate electrode and is also called a gate wiring. A scan line connected to the first gate electrode is called a first scan line and a scan line connected to the second gate electrode is called a second scan line. The first scan line and the second scan line may be provided independently or may be formed as one wiring.

In a full-color display device, when video signals corresponding to R (red), G (green), and B (blue) are sequentially sampled and supplied to a corresponding signal line, the number of terminals for connecting the shift register 406 and the analog switch 408 to each other corresponds to approximately ⅓ of the number of terminals for connecting the analog switch 408 and the signal line of the pixel portion 400 to each other. Accordingly, in comparison to the case where the analog switch 408 and the pixel portion 400 are formed over different substrates, the number of terminals used for connecting substrates which are separately formed can be suppressed when the analog switch 408 and the pixel portion 400 are formed over one substrate. Thus, occurrence probability of bad connection can be suppressed and yield can be improved.

Note that although the scan line driver circuit 402 in FIG. 30 includes the shift register 410 and the buffer 412, the present invention is not limited to this. The scan line driver circuit 402 may be formed using only the shift register 410.

Note that the structures of the signal line driver circuit and the scan line driver circuit are not limited to the structures shown in FIG. 30 which are merely one example of the display device.

Note that the signal line driver circuit and the scan line driver circuit may be formed over a different substrate (for example, a semiconductor substrate or an SOI substrate) from the pixel portion and then connected to the pixel portion or may be formed over the same substrate as the pixel circuit through the same process.

As the thin film transistor used for the pixel portion 400, the scan line driver circuit 402, and the signal line driver circuit 404, one or more of the thin film transistors described in Embodiment 1 to Embodiment 5 can be used. For example, in the thin film transistors used for the pixel portion 400, the scan line driver circuit 402, and the signal line driver circuit 404, the second gate electrode may be formed using the pixel electrode layer as described in Embodiment 2 and the like; alternatively, the second gate electrode and the like may be formed using the pixel electrode layer as described in Embodiment 2 only in the pixel portion 400 and the thin film transistor described in Embodiment 1 and the like may be used for the scan line driver circuit 402 and the signal line driver circuit 404. In the case of forming the scan line driver circuit 402 and the signal line driver circuit 404 over the same substrate as the pixel circuit, it is preferable to form the second gate electrode with the use of the pixel electrode layer in the thin film transistors used for the pixel portion 400, the scan line driver circuit 402, and the signal line driver circuit 404, as described in Embodiment 2 and the like because the manufacturing process is simplified.

Note that a connection method of a driver circuit which is formed over a different substrate is not limited to a particular method, and a known COG method, wire bonding method, TAB method, or the like can be used. Further, a connection position is not particularly limited to a certain position as long as electric connection is possible. Alternatively, a controller, a CPU, a memory, and the like may be formed over a different substrate and connected to the pixel circuit.

As described in Embodiment 6, the thin film transistor and the like described in Embodiment 1 to Embodiment 5 can be used for one of or both the pixel circuit and the driver circuits of the display device.

(Embodiment 7)

In Embodiment 7, electronic appliances in each of which a display panel or a display device manufactured by any of the methods described in the above Embodiment is incorporated as a display portion are described with reference to FIGS. 31A and 31B, FIG. 32, and FIGS. 33A to 33C. As such electronic devices, there are, for example, cameras such as video cameras or digital cameras, head mounted displays (goggle type displays), car navigation systems, projectors, car stereos, personal computers, and portable information terminals (such as mobile computers, mobile phones, and e-book readers). Examples of these devices are illustrated in FIGS. 31A and 31B.

Figure 31A:
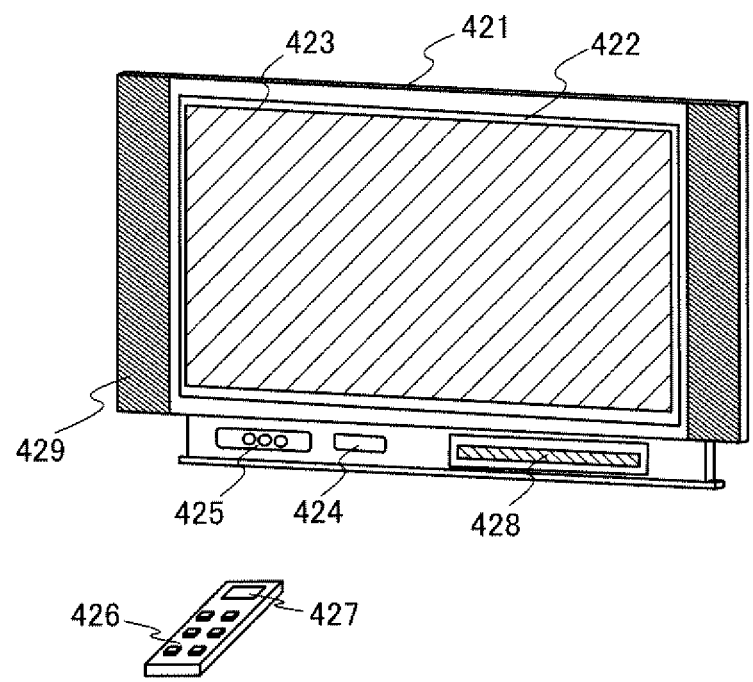
FIGS. 31A and 31B illustrate electronic appliances.
Figure 31B:
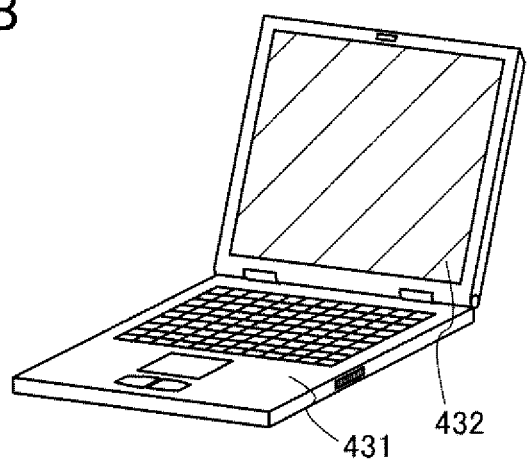

FIG. 31A illustrates a television device. The television device illustrated in FIG. 31A can be completed by incorporating the display panel described in Embodiment 6 in a housing. A main screen 423 is formed using a display panel manufactured according to the method described in Embodiment 1 to Embodiment 5. In addition, a speaker portion 429, operation switches, and the like are provided as accessory equipment.

As illustrated in FIG. 31A, a display panel 422 to which the manufacturing method described in Embodiment 1 to Embodiment 5 is applied is incorporated in a housing 421. General TV broadcast can be received by a receiver 2405. In addition, when the display device is connected to a communication network by wired or wireless connections via a modem 424, one-way (from a sender to a receiver) or two-way (between a sender and a receiver or between receivers) information communication can be performed. The television device can be operated using switches that are incorporated into the housing or by a remote control device 426 provided separately, and the remote control device 426 may also be provided with a display portion 427 that displays output information.

Further, the television device may include a sub-screen 428 formed using a second display panel for displaying channels, sound volume, and the like, in addition to the main screen 423.

Figure 32:
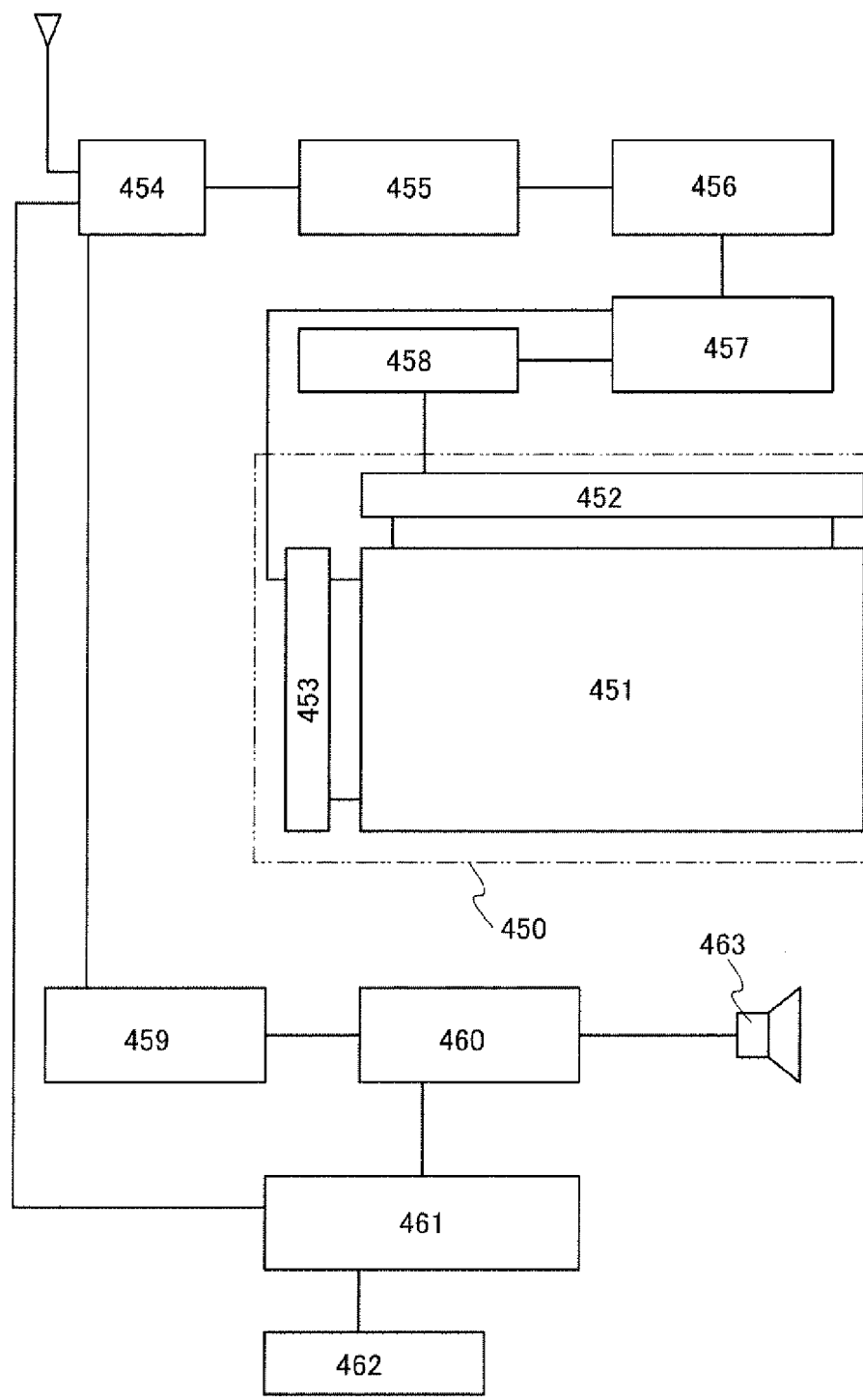
FIG. 32 is a block diagram of an electronic appliance.

FIG. 32 is a block diagram illustrating a main structure of the television device. A pixel portion 451 is formed in a display panel 450. A signal line driver circuit 452 and a scan line driver circuit 453 may be mounted on the display panel 450 by a COG method.

As other external circuits, a video signal amplifier circuit 455 which amplifies a video signal among signals received by a tuner 454, a video signal processing circuit 456 which converts a signal to be output therefrom into a chrominance signal corresponding to each color of red, green, and blue, a control circuit 457 which converts the video signal into a signal which meets input specs of a driver IC, and the like are provided on a video signal input side. The control circuit 457 outputs signals to a scan line side and a signal line side. In a case of digital driving, a signal division circuit 458 may be provided on the signal line side and an input digital signal may be divided into m pieces (m is a given integer) and supplied.

An audio signal among the signals received by the tuner 454 is transmitted to an audio signal amplifier circuit 459, the output of which is supplied to a speaker 463 through an audio signal processing circuit 460. A control circuit 461 receives control data related to the receiving station (reception frequency) or sound volume from an input portion 462 and transmits signals to the tuner 454 and the audio signal processing circuit 460.

Needless to say, the present invention is not limited to television devices, and can be applied to monitors of personal computers, or display media that have a large area, such as information display boards in railway stations, airports, and the like, and street-side advertisement display boards. Moreover, according to the present invention, monitors, information display boards, advertisement display boards which have high display quality (e.g., a high contrast ratio) can be provided.

By the use of the display panel or the display device described in the above Embodiment for the main screen 423 and the sub-screen 428, the television device can have high display quality in one of or both the main screen and the sub-screen.

A portable computer illustrated in FIG. 31B includes a main body 431, a display portion 432, and the like. By the use of the display panel or the display device, to which the manufacturing method of the display device described in the above Embodiment is applied, for the display portion 432, the display portion of the television device can have high display quality.

Figure 33A:
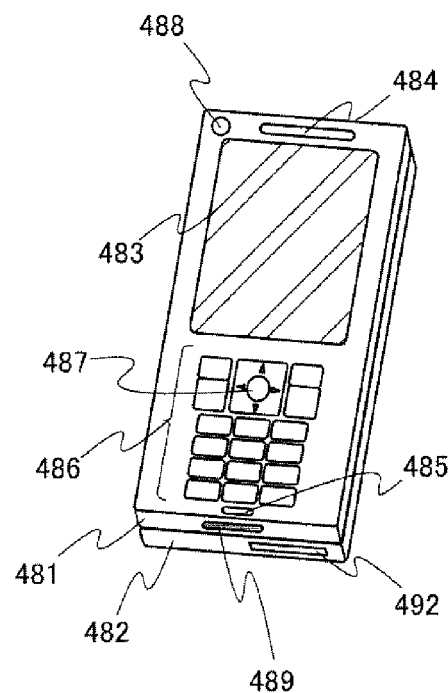
FIGS. 33A to 33C illustrate electronic appliances.
Figure 33B:
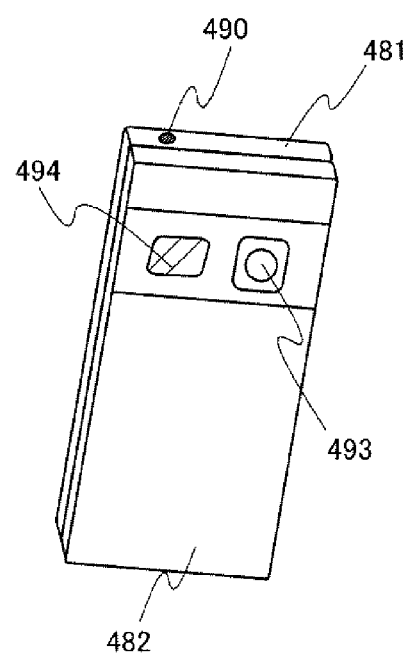
Figure 33C:
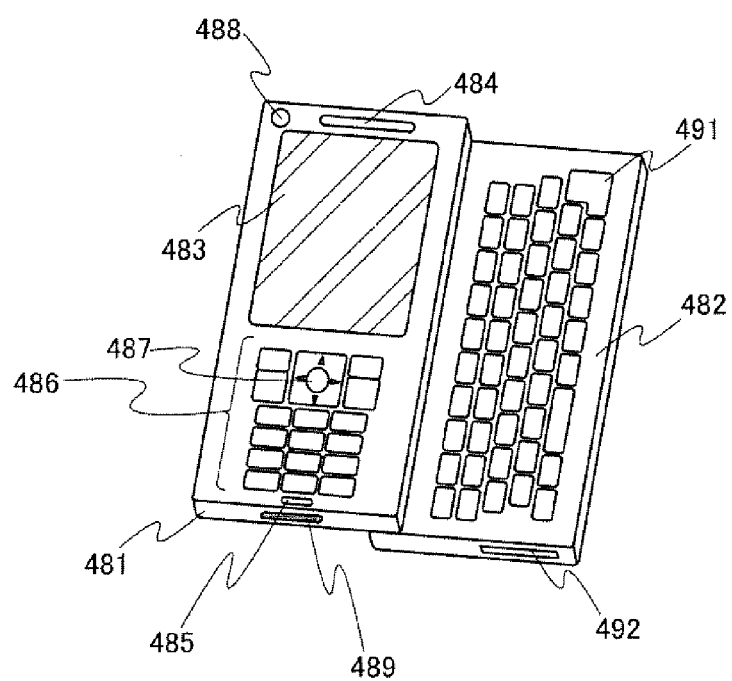

FIGS. 33A to 33C illustrate an example of a cellular phone; FIG. 33A is a front view, FIG. 33B is a rear view, and FIG. 33C is a front view when the phone is slid open. The cellular phone illustrated in FIGS. 33A to 33C includes two housings: a housing 481 and a housing 482. The cellular phone in FIGS. 33A to 33C is a so-called smartphone which has both a function as a phone and a function as an information terminal, and incorporates a computer to conduct a variety of data processing in addition to voice calls.

The cellular phone illustrated in FIGS. 33A to 33C includes the housing 481 and the housing 482. The housing 481 includes a display portion 483, a speaker 484, a microphone 485, operation keys 486, a pointing device 487, a front camera lens 488, a jack 489 for an external connection terminal, an earphone terminal 490, and the like, while the housing 482 includes a keyboard 491, an external memory slot 492, a rear camera 493, a light 494, and the like. In addition, an antenna is incorporated in the housing 481.

The cellular phone illustrated in FIGS. 33A to 33C may have a noncontact IC chip, a compact storage device, and the like incorporated in addition to the above structure.

The housings 481 and 482 which overlap with each other (see FIG. 33A) can be slid open, whereby the cellular phone is developed as illustrated in FIG. 33C. The display panel or display device completed by any of the manufacturing method of a display device described in the above embodiment can be incorporated in the display portion 483. Since the front camera lens 488 is provided in the same plane as the display portion 483, the cellular phone can be used as a videophone. A still image and a moving image can be taken by the rear camera 493 and the light 494 when the display portion 483 is used as a viewfinder.

With the use of the speaker 484 and the microphone 485, the cellular phone illustrated in FIGS. 33A to 33C can also be used as an audio recording device (a recording device) or an audio reproducing device. With the use of the operation keys 486, further, operations of incoming and outgoing of calls, simple information input such as input of electronic mail, scrolling of a screen of the display portion, cursor movement, e.g., for selecting information to be displayed on the display portion, and the like are possible.

When much information is handled, for example, when the cellular phone is used for documentation or used as a portable information terminal, the use of the keyboard 491 is convenient. By sliding the housings 481 and 482 which overlap with each other (see FIG. 33A), the housings 481 and 482 can be developed as shown in FIG. 33C. In the case where the cellular phone is used as a portable information terminal, a cursor can be moved smoothly with the keyboard 491 and the pointing device 487. To the jack 489 for an external connection terminal, an AC adaptor and various types of cables such as a USB cable can be connected, and charging and data communication with a personal computer or the like are possible. Moreover, by inserting a recording medium into the external memory slot 492, the cellular phone can deal with storing and moving of a large amount of data.

The rear face of the housing 482 (see FIG. 33B) is provided with the rear camera 493 and the light 494, and a still image and a moving image can be taken when the display portion 483 is used as a viewfinder.

Further, the cellular phone may have an infrared communication function, a USB port, a function of receiving one segment television broadcast, a noncontact IC chip, an earphone jack, or the like, in addition to the above-described functions and structures.

The electronic appliances described in Embodiment 7 can be manufactured by the methods for manufacturing the thin film transistor and the display device described in any of Embodiment 1 to Embodiment 6. Therefore, the display portions of the electronic appliances can have high display quality.

This application is based on Japanese Patent Application serial no. 2008-202387 filed with Japan Patent Office on Aug. 5, 2008 and Japanese Patent Application serial no. 2008-202439 filed with Japan Patent Office on Aug. 5, 2008, the entire contents of which are hereby incorporated by reference.

What is claimed is:

1. A semiconductor device comprising:
   a first gate electrode layer over a substrate;
   a first gate insulating layer over the first gate electrode layer;
   a conductive layer over and in contact with the first gate insulating layer, the conductive layer overlapping the first gate electrode layer;

a semiconductor layer over the conductive layer and the first gate insulating layer;

a source electrode layer over the semiconductor layer, the source electrode layer overlapping a first portion of the first gate electrode layer;

a drain electrode layer over the semiconductor layer, the drain electrode layer overlapping a second portion of the first gate electrode layer;

a second gate insulating layer over the semiconductor layer; and a second gate electrode layer over the second gate insulating layer, the second gate electrode layer overlapping a third portion of the first gate electrode layer between the first portion and the second portion, wherein the semiconductor layer is in contact with the first gate insulating layer over the third portion of the first gate electrode layer.

2. The semiconductor device according to claim 1, wherein one of the source electrode and drain electrode layers overlaps the conductive layer, and the other of the source electrode and drain electrode layers does not overlap the conductive layer.

3. A display device comprising the semiconductor device according to claim 1.

4. The display device according to claim 3, wherein the second gate electrode layer is the same layer as a pixel electrode layer.

5. The display device according to claim 4, wherein the pixel electrode layer is formed from a material having a light-transmitting property.

6. A semiconductor device comprising:
a first gate electrode layer over a substrate;
a first gate insulating layer over the first gate electrode layer;
a first conductive layer over the first gate insulating layer, the first conductive layer overlapping a first portion of the first gate electrode layer;
a second conductive layer over the first gate insulating layer, the second conductive layer overlapping a second portion of the first gate electrode layer;
a semiconductor layer over the first and second conductive layers and the first gate insulating layer;
a source electrode layer over the semiconductor layer;
a drain electrode layer over the semiconductor layer;
a second gate insulating layer over the semiconductor layer; and
a second gate electrode layer over the second gate insulating layer, the second gate electrode layer overlapping a third portion of the first gate electrode layer between the first portion and the second portion,
wherein the semiconductor layer is in contact with the first gate insulating layer over the third portion of the first gate electrode layer.

7. A display device comprising the semiconductor device according to claim 6.

8. The display device according to claim 7, wherein the second gate electrode layer is the same layer as a pixel electrode layer.

9. The display device according to claim 8, wherein the pixel electrode layer is formed from a material having a light-transmitting property.

* * * * *